United States Patent
Sun et al.

(10) Patent No.: US 11,482,669 B2
(45) Date of Patent: Oct. 25, 2022

(54) MEMORY DEVICE AND A METHOD FOR FORMING THE MEMORY DEVICE

(71) Applicant: GLOBALFOUNDRIES Singapore Pte. Ltd., Singapore (SG)

(72) Inventors: Jianxun Sun, Singapore (SG); Juan Boon Tan, Singapore (SG); Tu Pei Chen, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 33 days.

(21) Appl. No.: 16/565,524

(22) Filed: Sep. 10, 2019

(65) Prior Publication Data
US 2021/0074916 A1 Mar. 11, 2021

(51) Int. Cl.
*H01L 45/00* (2006.01)
*H01L 27/24* (2006.01)

(52) U.S. Cl.
CPC ............ *H01L 45/146* (2013.01); *H01L 27/24* (2013.01); *H01L 45/1608* (2013.01); *H01L 45/1675* (2013.01)

(58) Field of Classification Search
CPC ....... H01L 43/08; H01L 45/144; H01L 45/14; H01L 45/143; G11C 11/161
See application file for complete search history.

(56) References Cited

U.S. PATENT DOCUMENTS

| | | | | |
|---|---|---|---|---|
| 9,450,021 B1* | 9/2016 | Lee | ................ | H01L 45/085 |
| 10,141,503 B1* | 11/2018 | BrightSky | ........... | H01L 45/1246 |
| 2009/0179245 A1* | 7/2009 | Karg | .................. | G11C 11/1673 257/295 |
| 2014/0063924 A1* | 3/2014 | Nakai | ................ | G11C 13/0069 365/158 |
| 2014/0247648 A1* | 9/2014 | Yoon | .................. | G11C 13/0002 257/421 |
| 2015/0170923 A1* | 6/2015 | Nardi | ................ | H01L 21/28123 438/745 |
| 2015/0249110 A1* | 9/2015 | Do | .......................... | H01L 43/08 257/421 |
| 2015/0262637 A1* | 9/2015 | Park | .................... | G06F 12/0802 365/158 |
| 2017/0005139 A1* | 1/2017 | Lee | .................... | G11C 13/0002 |
| 2017/0338279 A1* | 11/2017 | Yang | .................... | H01L 27/224 |

(Continued)

OTHER PUBLICATIONS

Sahu et al., "Remote control of resistive switching in TiO2 based resistive random access memory device", Scientific Reports, 2017, 8 pages, vol. 7.

(Continued)

*Primary Examiner* — Bradley Smith
*Assistant Examiner* — David J Goodwin
(74) *Attorney, Agent, or Firm* — Viering Jentschura & Partner MBB

(57) ABSTRACT

A memory device may include a first conductor and a second conductor; a switching layer arranged between the first conductor and the second conductor, and one or more magnetic layers. The switching layer may be configured to have a switchable resistance in response to a change in voltage between the first conductor and the second conductor. The one or more magnetic layers may be arranged such that the one or more magnetic layers provide a magnetic field through the switching layer.

20 Claims, 16 Drawing Sheets

(56) References Cited

U.S. PATENT DOCUMENTS

2019/0334083 A1* 10/2019 Wu ..................... H01L 45/145
2020/0083285 A1* 3/2020 Nagase ............... H01F 10/3254

OTHER PUBLICATIONS

Wang et al., "Magnetic field controllable nonvolatile resistive switching effect in silicon device", Applied Physics Letters, 2014, 6 pages, vol. 104.

Li, et al., "Light and magnetic field double modulation on the resistive switching behavior in BaTiO3/FeMn/BaTiO3 trilayer films", Physics Letters A, 2017, pp. 2127-2130, vol. 381.

Sun et al., "Magnetic-field and white-light controlled resistive switching behaviors in Ag/[BiFeO3/γ-Fe2O3]/FTO device", RSC Advances, 2015, pp. 13513-13518, vol. 5.

Chen et al., "Resistive Switching and Magnetic Modulation in Cobalt-Doped ZnO", Advanced Materials, 2012, pp. 3515-3520, vol. 24.

\* cited by examiner

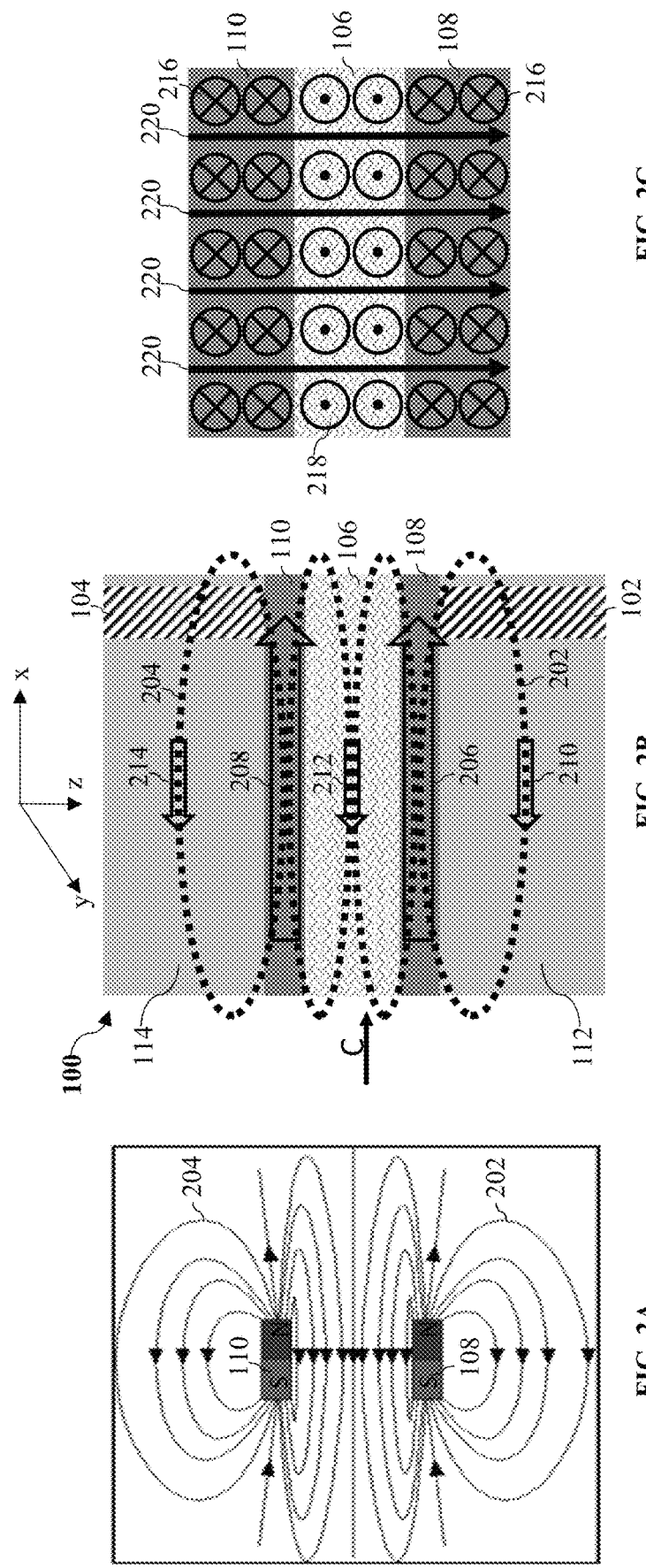

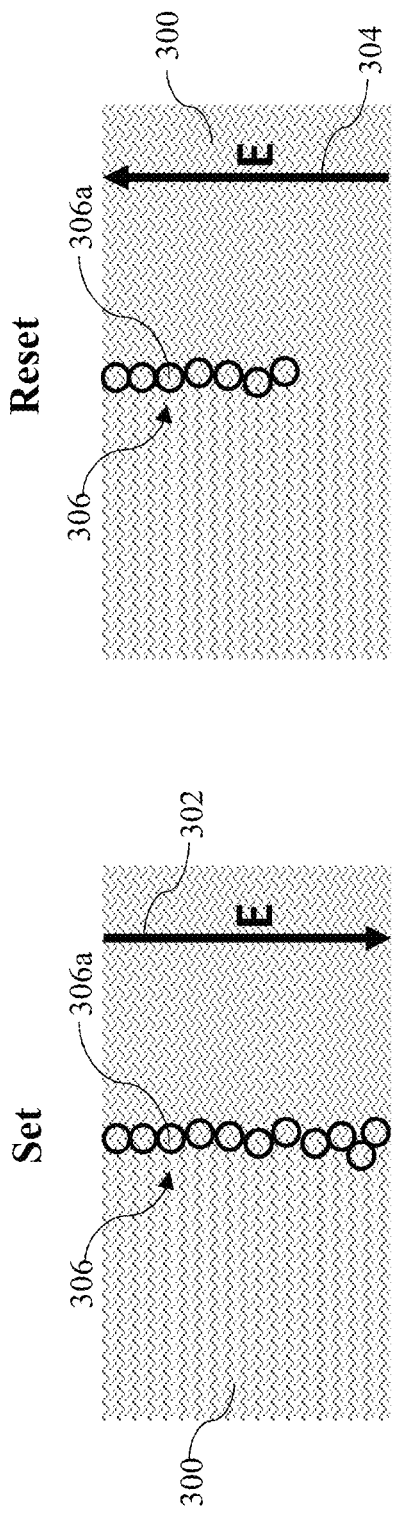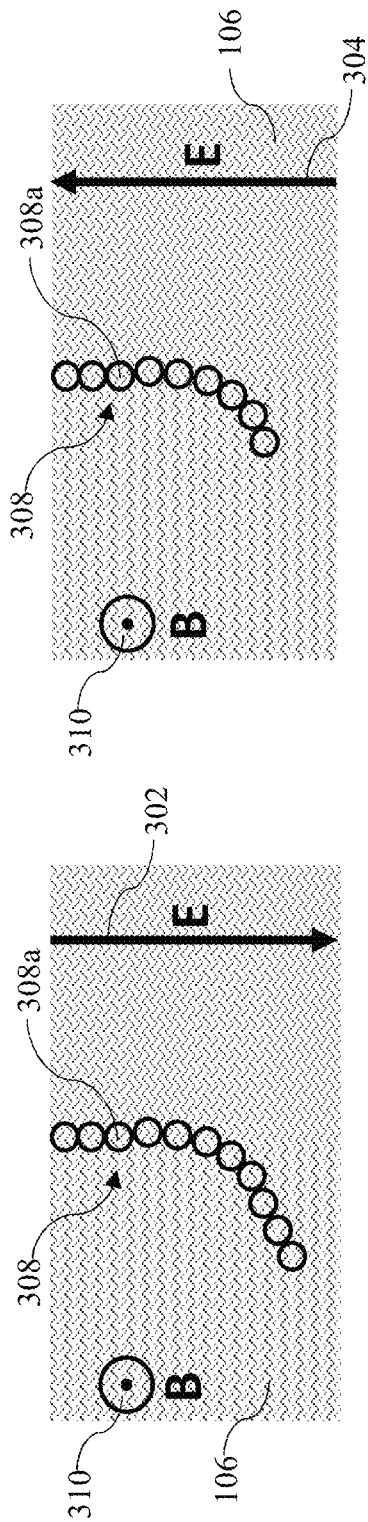

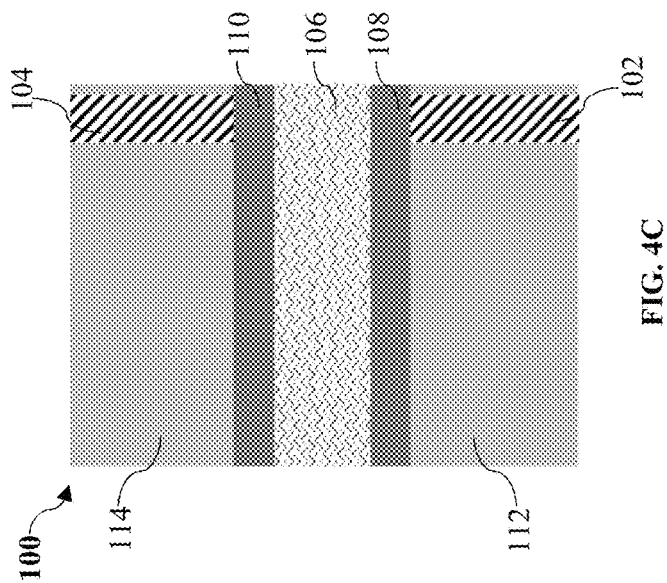
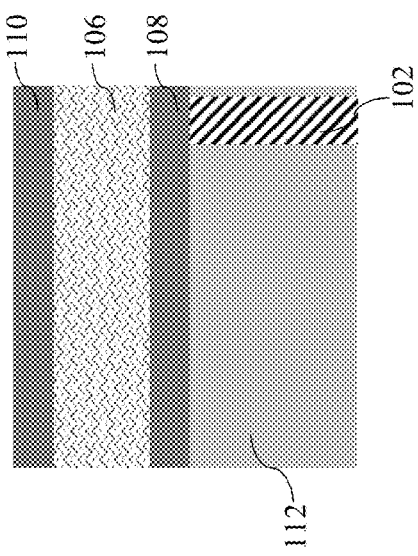
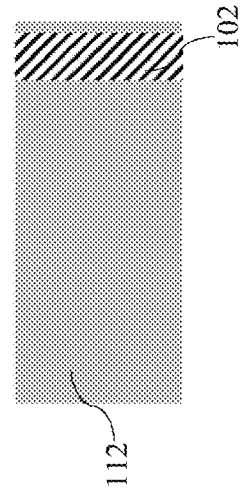
FIG. 4C
FIG. 4B
FIG. 4A

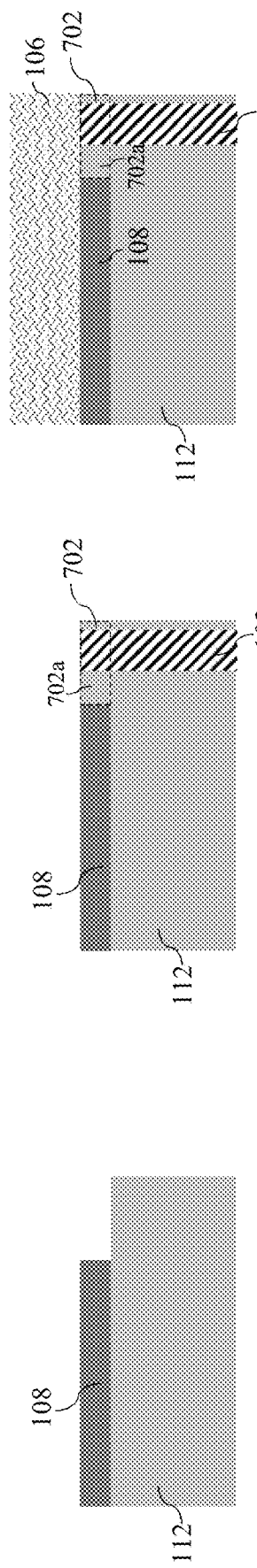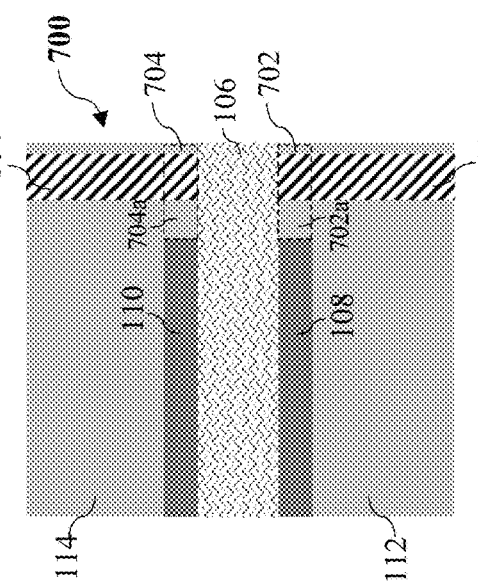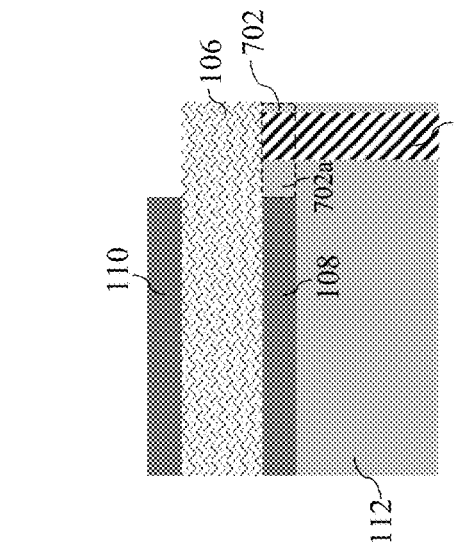

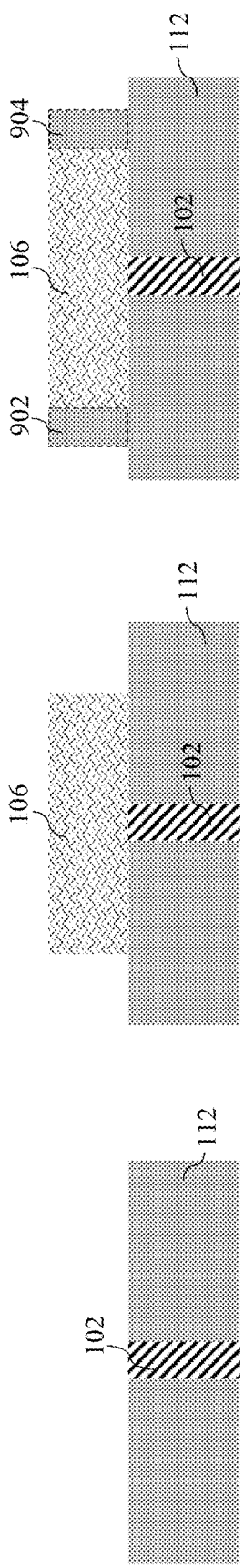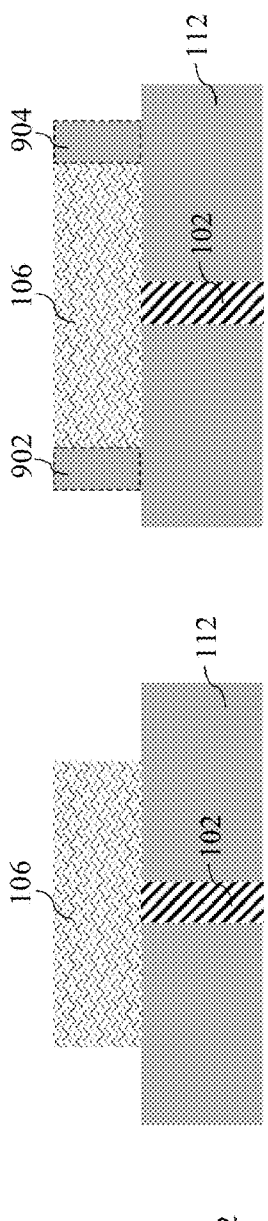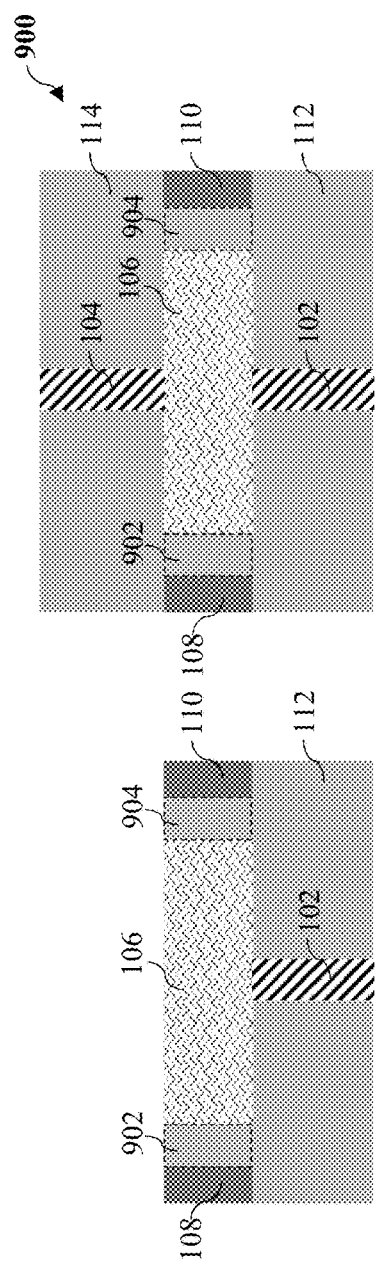

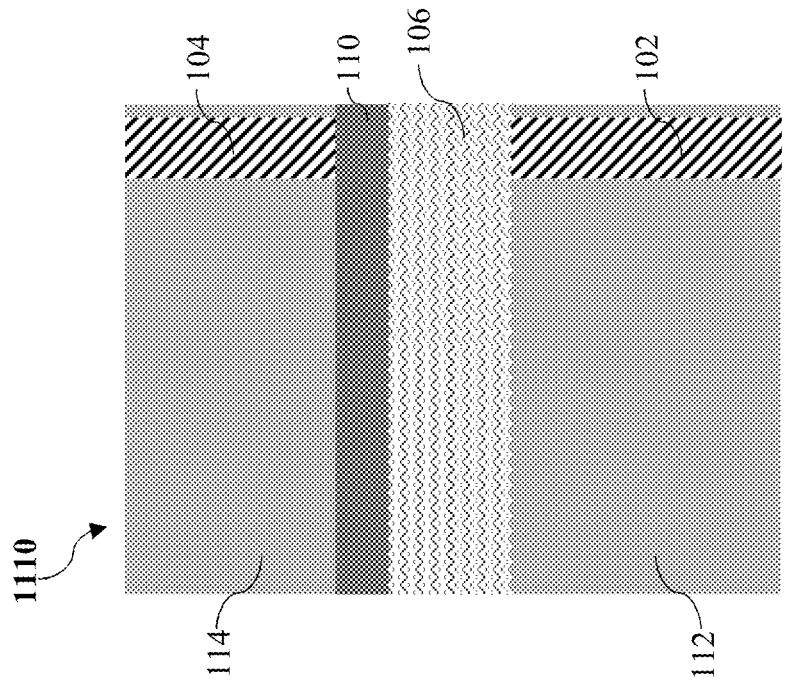
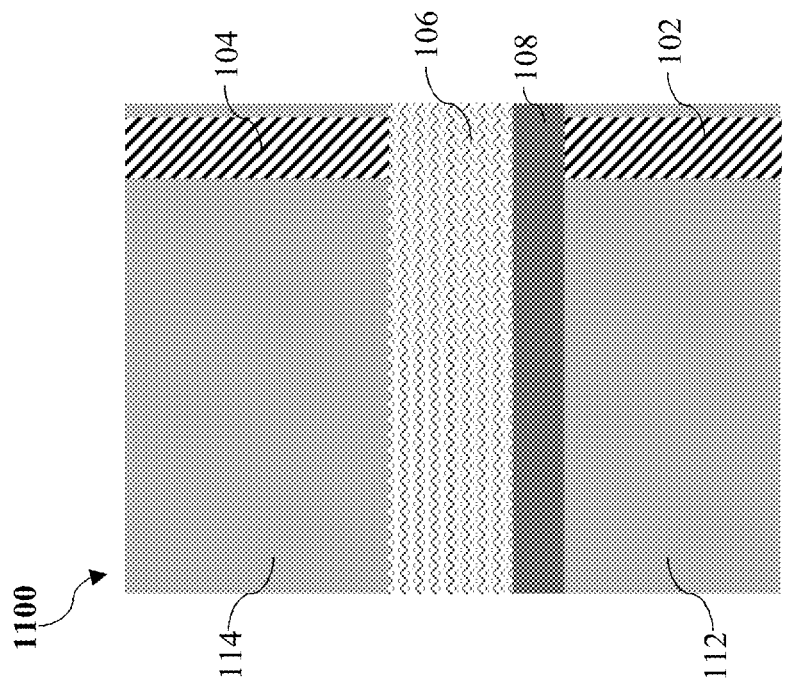
FIG. 11B
FIG. 11A

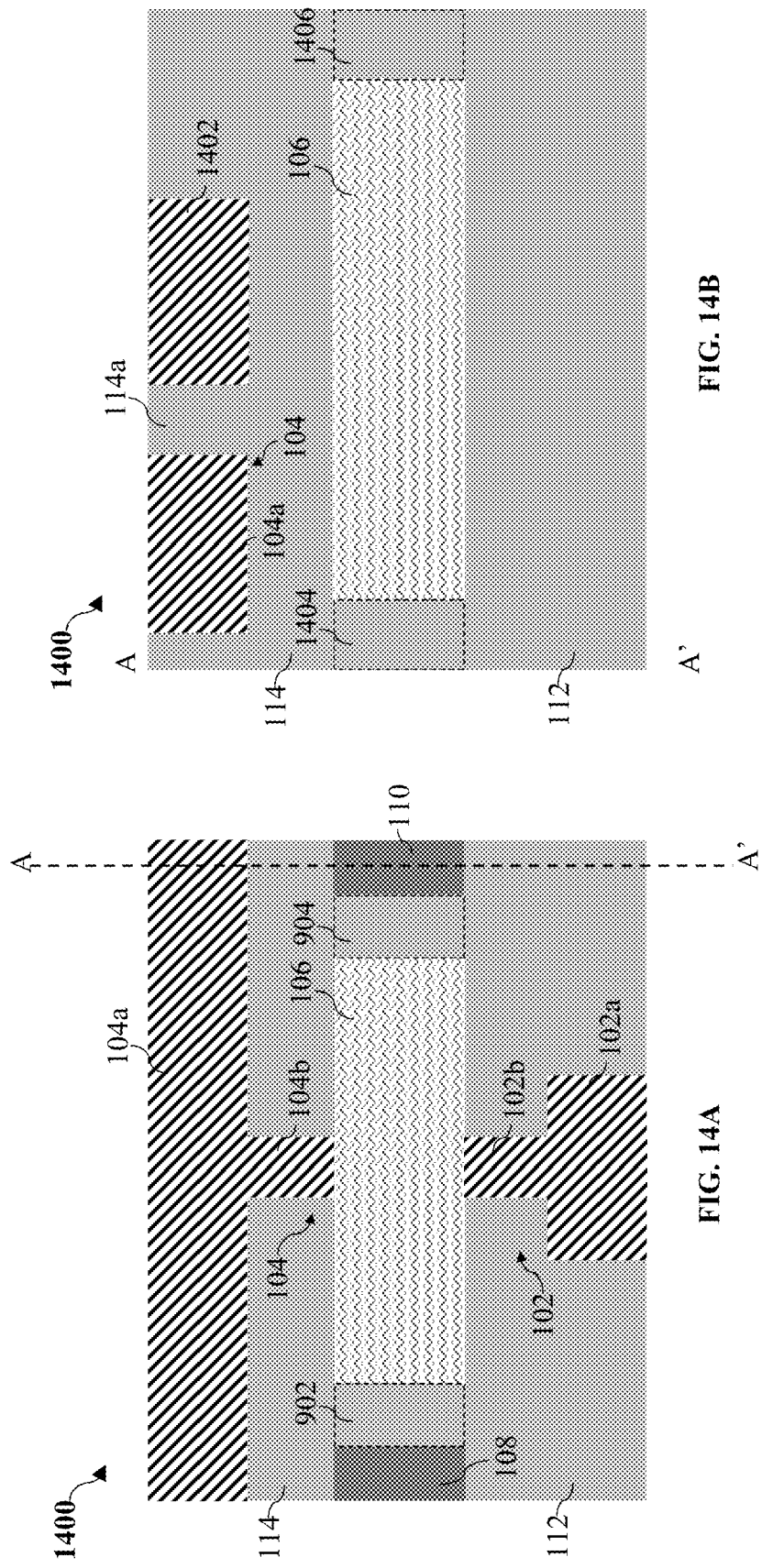

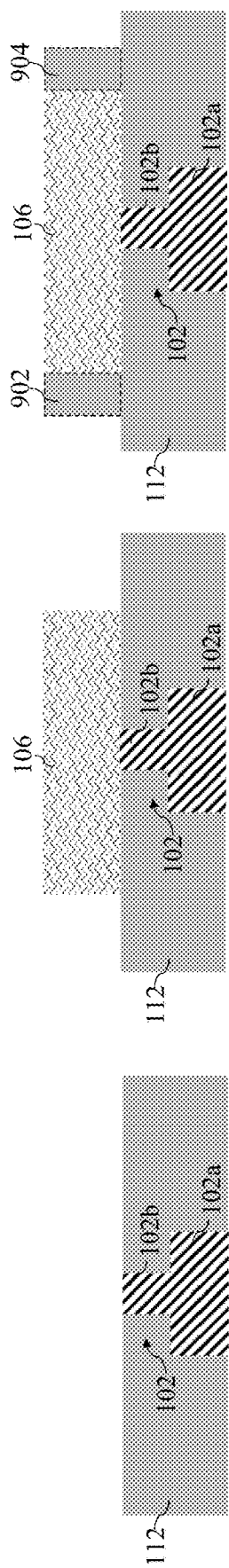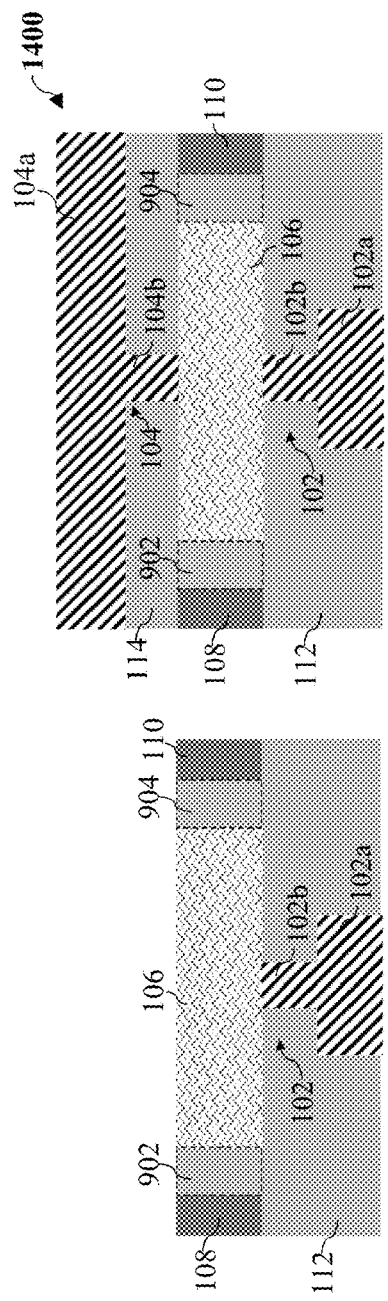

MEMORY DEVICE AND A METHOD FOR FORMING THE MEMORY DEVICE

TECHNICAL FIELD

The present disclosure relates generally to memory devices and methods for forming the memory devices.

BACKGROUND

Non-volatile memory devices, such as resistive random access memory (RRAM) devices, may be used for several applications. For some of these applications, a gradual change in the state of the memory device (e.g. if the memory device is a RRAM device, a gradual change in the resistance of the RRAM device) may be preferable. An example of such an application is in the area of neuromorphic computing.

However, several memory devices today operate with abrupt changes in their states. For instance, the change in the resistance of most currently available filament type RRAMs is often abrupt. Moreover, the resistive window for current RRAM-based synapse devices is usually small (e.g. about 10) and hence, the computing accuracy of the synapse device is often low.

Accordingly, it is desirable to provide a memory device with a more gradual change in its state.

SUMMARY

According to various non-limiting embodiments, there is provided a memory device including: a first conductor and a second conductor; a switching layer arranged between the first conductor and the second conductor, wherein the switching layer may be configured to have a switchable resistance in response to a change in voltage between the first conductor and the second conductor; and one or more magnetic layers arranged such that the one or more magnetic layers may provide a magnetic field through the switching layer.

According to various non-limiting embodiments, there is provided a method including: forming a switching layer; arranging the switching layer between a first conductor and a second conductor; wherein the switching layer may be configured to have a switchable resistance in response to a change in voltage between the first conductor and the second conductor; and arranging one or more magnetic layers such that the one or more magnetic layers provide a magnetic field through the switching layer.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIG. 2A shows a schematic diagram of a magnetic field provided by magnetic layers of the memory device of FIG. 1, FIG. 2B shows the cross-sectional view of FIG. 1 with the magnetic field provided by the magnetic layers, and FIG. 2C shows the magnetic field provided by the magnetic layers as seen from a different direction;

FIGS. 3A to 3D show simplified cross-sectional views that illustrate how the magnetic field provided by the magnetic layers in the memory device of FIG. 1 affect conducting filament formation in a switching layer of the memory device;

FIGS. 4A to 4C show simplified cross-sectional views that illustrate a method for fabricating the memory device of FIG. 1 according to various non-limiting embodiments;

FIGS. 8A to 8E show simplified cross-sectional views that illustrate a method for fabricating the memory device of FIG. 7 according to various non-limiting embodiments;

FIGS. 10A to 10E show simplified cross-sectional views that illustrate a method for fabricating the memory device of FIG. 9 according to various non-limiting embodiments;

FIGS. 11A and 11B show simplified cross-sectional views of memory devices according to alternative non-limiting embodiments;

FIGS. 14A and 14B show simplified cross-sectional views of a memory device according to alternative non-limiting embodiments;

FIGS. 15A to 15E show simplified cross-sectional views that illustrate a method for fabricating the memory device of FIGS. 14A and 14B.

DETAILED DESCRIPTION

Figure 1:
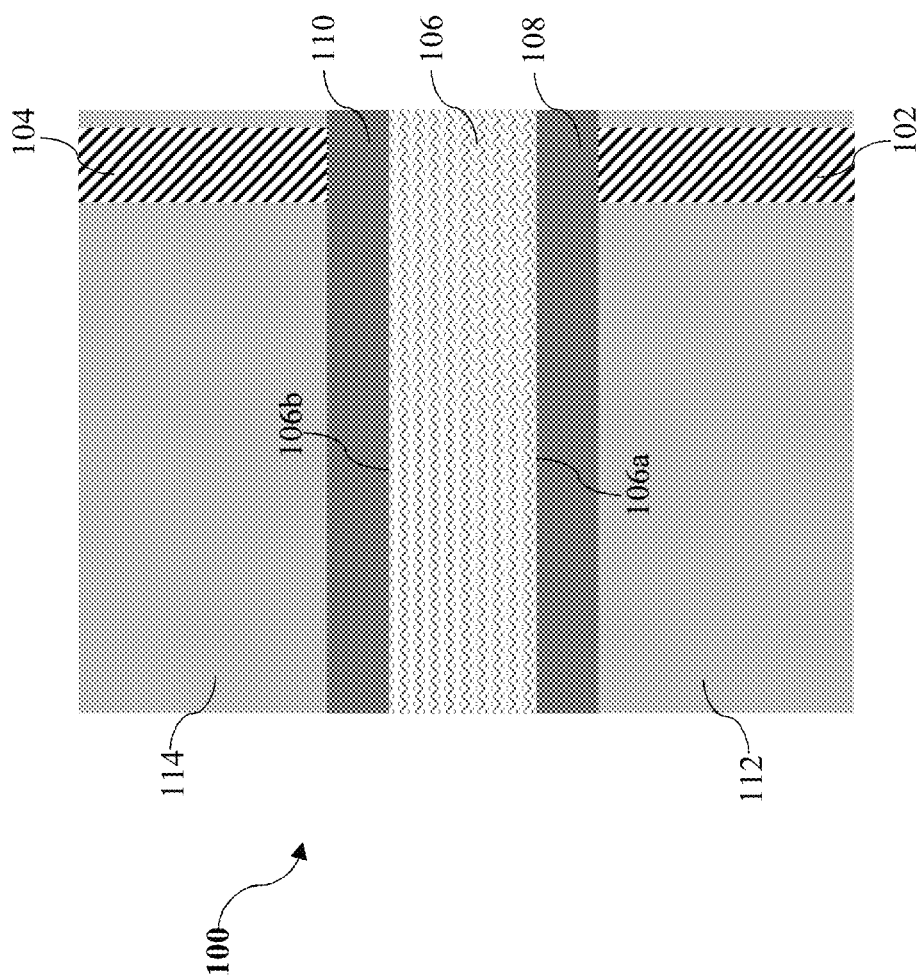
FIG. 1 shows a simplified cross-sectional view of a memory device according to various non-limiting embodiments.

The embodiments generally relate to devices, such as semiconductor devices. More particularly, some embodiments relate to memory devices, for example, non-volatile memory devices such as RRAM devices. The memory devices may be used in several applications, for example, in neuromorphic applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a memory device 100 according to various non-limiting embodiments. The memory device 100 may be a RRAM device. For example, the memory device 100 may be an oxide RRAM device in some exemplary non-limiting embodiments, or a conductive bridging RRAM (CBRAM) device in other exemplary non-limiting embodiments.

The memory device 100 may include a first conductor 102 and a second conductor 104. In various non-limiting embodiments, the first conductor 102 and the second conduction 104 may be in the form of vias. In various non-limiting embodiments, the first and second conductors 102, 104 may be formed of conductive material typically used in a back end of line (BEOL) process. The conductive material may be non-ferromagnetic. For example, the conductors 102, 104 may be formed of aluminium, copper, tungsten, alloys thereof, or combinations thereof. Each conductor 102, 104 may be cylindrical in shape and may have a diameter in the order of tens of nanometers (nm) to hundreds of nanometers (nm). In particular, each conductor 102, 104 may have a diameter ranging from about 63 nm to about 153 nm in various non-limiting embodiments.

The memory device 100 may further include a switching layer 106 arranged between the first conductor 102 and the second conductor 104. In various non-limiting embodiments, the memory device 100 may be an oxide RRAM and the switching layer 106 may include an oxide material such as, but not limited to, silicon dioxide. In alternative non-limiting embodiments, the memory device 100 may be a CBRAM and the switching layer 106 may include solid electrolytes. The solid electrolytes may include non-oxides (such as, but not limited to, chalcogenides e.g. germanium-selenium ($GeSe_x$), germanium sulphide ($GeS_2$), germanium telluride (GeTe), copper sulphide ($Cu_2S$), silver sulphide ($Ag_2S$)), and/or oxides such as, but not limited to, tantalum oxide ($Ta_2O_5$), silicon dioxide ($SiO_2$), zirconium oxide ($ZrO_2$), germanium oxide ($GeO_x$), aluminium oxide ($Al_2O_3$), hafnium oxide ($H_2$), titanium oxide ($TiO_2$) or combinations thereof. However, the switching layer 106 may be formed of any other material known to those skilled in the art. Further, the switching layer 106 may have a thickness ranging from a few nm to the order of tens of nm in various non-limiting embodiments. In particular, the switching layer 106 may have a thickness ranging from about 5 nm to about 50 nm in various non-limiting embodiments.

The memory device 100 may also include one or more magnetic layers arranged such that the one or more magnetic layers provide a magnetic field through the switching layer 106. For example, in various non-limiting embodiments, the memory device 100 may include one or more magnetic layers arranged in parallel to one or more sides of the switching layer 106. In various non-limiting embodiments, at least one magnetic layer may be arranged horizontally parallel to the switching layer 106. In various non-limiting embodiments, at least one magnetic layer may be arranged between the switching layer 106 and at least one conductor 102, 104. Further, the switching layer 106 may contact at least one magnetic layer.

For example, as shown in FIG. 1, in various non-limiting embodiments, the memory device 100 may include a first magnetic layer 108 and a second magnetic layer 110 arranged horizontally parallel to the switching layer 106. The first magnetic layer 108 may be arranged parallel to and may contact a bottom side 106a of the switching layer 106, whereas the second magnetic layer 110 may be arranged parallel to and may contact a top side 106b of the switching layer 106 (note that the sides 106a, 106b are not labelled in the remaining figures to avoid cluttering the figures). In other words, the switching layer 106 may be arranged between the first magnetic layer 108 and the second magnetic layer 110, and may contact both magnetic layers 108, 110. Further, the first magnetic layer 108 may be arranged between the switching layer 106 and the first conductor 102, and the second magnetic layer 110 may be arranged between the switching layer 106 and the second conductor 104.

In various non-limiting embodiments, each magnetic layer 108, 110 may be configured to provide a magnetic field in the absence of external stimuli. For instance, the magnetic layers 108, 110 may be formed of ferromagnetic material with aligned electron spin orientation. The ferromagnetic material may, for example, be cobalt-iron-boron (CoFeB), cobalt-platinum (Co/Pt), or combinations thereof. However, the magnetic layers 108, 110 may be formed of other materials as known to those skilled in the art. In various non-limiting embodiments, a thickness of the first magnetic layer 108 may be substantially the same as a thickness of the second magnetic layer 110. However, the first magnetic layer 108 may have a different thickness from the second magnetic layer 110 in alternative non-limiting embodiments. In various non-limiting embodiments, a thickness of each magnetic layer 108, 110 may be in the order of a few nm. In particular, a thickness of each magnetic layer 108, 110 may range from about 0.5 nm to about 2 nm in exemplary non-limiting embodiments. In various non-limiting embodiments, the magnetic field strength provided by each magnetic layer 108, 110 may range from about 0.1 T to about 1.5 T. The magnetic field strength provided by each magnetic layer 108, 110 may be affected by one or more of the following: annealing temperature, thickness of the magnetic layer 108, 110, material composition of the magnetic layer 108, 110 (e.g. intermixing ratio of different elements in the magnetic layer 108, 110). For instance, the magnetic field strength provided by each magnetic layer 108, 110 may be stronger if the annealing temperature is lower, if the magnetic layer 108, 110 is thicker, or if the magnetic layer 108, 110 includes a greater percentage of iron.

The memory device 100 may further include a first insulating layer 112 and a second insulating layer 114. The first magnetic layer 108 may be arranged over the first insulating layer 112 and the first conductor 102 may be arranged through the first insulating layer 112. The second insulating layer 114 may be arranged over the second magnetic layer 110 and the second conductor 104 may be arranged through the second insulating layer 114. In various non-limiting embodiments, the insulating layers 112, 114 may be formed of dielectric material typically used in a back end of line (BEOL) process. For example, the insulating layers 112, 114 may be formed of silicon oxide (SiO), silicon dioxide ($SiO_2$), silicon nitride (SiN) or combinations thereof. However, the insulating layers 112, 114 may be formed of any material as known to those skilled in the art. A thickness of the first insulating layer 112 may be substantially the same as a thickness of the second insulating layer 114 in some exemplary non-limiting embodiments, but may be different in other exemplary non-limiting embodiments. In various non-limiting embodiments, each insulating layer 112, 114 may have a thickness in the order of hundreds of nm. In particular, each insulating layer 112, 114 may have a thickness ranging from about 140 nm to about 365 nm in various non-limiting embodiments.

FIG. 2A shows a schematic diagram of the magnetic field provided by the first and second magnetic layers 108, 110. FIG. 2B shows the cross-sectional view of the memory device 100 with the magnetic field provided by the magnetic layers 108, 110. FIG. 2C shows the direction of the magnetic field through part of the memory device 100 as seen from direction "C" of FIG. 2B.

As shown in FIG. 2A, in various non-limiting embodiments, each magnetic layer 108, 110 may behave like a permanent magnet having a north (N) pole and a south (S) pole and thus, may provide a magnetic field around it. In FIGS. 2A and 2B, the magnetic field provided by the first magnetic layer 108 may be represented by magnetic field lines 202; whereas, the magnetic field provided by the second magnetic layer 110 may be represented by magnetic field lines 204.

In the exemplary non-limiting embodiment in FIG. 2B, the magnetic field (or spin direction) provided by the first and second magnetic layers 108, 110 may be along an x-direction from left to right (represented by the arrows 206, 208 respectively). In other words, the magnetic field provided by the magnetic layers 108, 110 may be into the paper as seen from direction "C" (represented by the symbols 216 in FIG. 2C). As shown by the magnetic field lines 202, 204, the magnetic field provided by each magnetic layer 108, 110 may pass through the switching layer 106 and the insulating layers 112, 114. The direction of the magnetic field through the switching layer 106 and the insulating layers 112, 114 may also be along the x-direction, but from right to left (represented by the arrows 210, 212, 214). In other words, the magnetic field may pass through the switching layer 106 and the insulating layers 112, 114 in a direction out of the paper as seen from direction "C" (represented by the symbols 218 in FIG. 2C). FIG. 2C further shows the direction of an electric field (represented by the arrows 220) through the switching layer 106, when a voltage is applied between the first and second conductors 102, 104. However, the directions of the magnetic fields and the electric field may be different in alternative non-limiting embodiments.

In various non-limiting embodiments, the switching layer 106 may be configured to have a switchable resistance in response to a change in voltage between the first conductor 102 and the second conductor 104, and the memory device 100 may be set and reset by switching the resistance of the switching layer 106. In an exemplary non-limiting embodiment, the switching layer 106 may have a resistance switchable between a lower resistance value and a higher resistance value in response to a change in voltage between the first conductor 102 and the second conductor 104. For instance, to set the memory device 100, a first voltage may be applied between the first and second conductors 102, 104, which may cause a conducting filament to be formed within the switching layer 106 and in turn, the resistance of the switching layer 106 may have the lower resistance value. To reset the memory device 100, a second voltage may be applied between the first and second conductors 102, 104, which may cause the conducting filament to be broken and in turn, the resistance of the switching layer 106 may have the higher resistance value.

In various non-limiting embodiments, the memory device 100 may be an oxide RAM and the first voltage may be higher than the second voltage. Applying the first voltage between the first and second conductors 102, 104 may cause a dielectric breakdown in the switching layer 106, which may then form the conducting filament. Applying the second voltage between the first and second conductors 102, 104 may reverse the dielectric breakdown to break the conducting filament. In various non-limiting embodiments where the memory device 100 may be an oxide RAM, the lower resistance value may range from about 100Ω to about 1KΩ; the higher resistance value may range from about 1KΩ to about 1MΩ; the first voltage may range from about 0.5V to about 1V, and the second voltage may range from about −0.5V to about −1V.

In alternative non-limiting embodiments, the memory device 100 may be a CBRAM and the first voltage may be of a different polarity from the second voltage. Applying the first voltage between the first and second conductors 102, 104 may oxidize one of the conductors 102, 104 and the oxidized metal ions from the oxidized conductor 102, 104 may migrate towards the other conductor 102, 104 to form the conducting filament. Applying the second voltage between the first and second conductors 102, 104 may cause the oxidized metal ions to migrate in the reverse direction, hence breaking the conducting filament. In various non-limiting embodiments where the memory device 100 may be an CBRAM, the lower resistance value may range from about 100Ω to about 1KΩ; the higher resistance value may range from about 1KΩ to about 1MΩ; the first voltage may range from about 0.5V to about 1V, and the second voltage may range from about −0.5V to about −1V.

FIGS. 3A and 3B show simplified cross-sectional views of a switching layer 300 of a memory device similar to memory device 100, but without the magnetic layers 108, 110. In particular, FIG. 3A shows setting of the memory device; whereas, FIG. 3B shows resetting of the memory device. FIG. 3C shows setting of the memory device 100; whereas, FIG. 3D shows resetting of the memory device 100.

As shown in FIGS. 3A and 3C, when a first voltage (resulting in a first electric field (E) 302) is applied across the switching layer 300/106, a conducting filament 306/308 may be formed within the switching layer 300/106. As shown in FIGS. 3B and 3D, when a second voltage (resulting in a second electric field (E) 304) is applied across the switching layer 300/106, the conducting filament 306/308 may be broken. Each conducting filament 306, 308 may include positively charged particles (e.g. particles 306a, 308a) and may be formed by the migration of these positively charged particles across the switching layer 300, 106. In some exemplary non-limiting embodiments, the positively charged particles may include oxygen vacancies. Comparing FIGS. 3C and 3D against FIGS. 3A and 3B, in various non-limiting embodiments, the magnetic field (B) 310 provided by the magnetic layers 108, 110 through the switching layer 106 may exert a Lorentz force on the positively charged particles, causing the migration path of the positively charged particles (and hence the conducting filament 308) to bend. This may suppress the setting of the memory device 100 and hence, achieve a more gradual change in the resistance of the memory device 100. In addition, with the magnetic field (B) 310 through the switching layer 106, the lower resistance value of the switching layer 106 (when the memory device 100 is set) may be changed, and a larger resistive window of the memory device 100 may be achieved.

The memory device 100 may be fabricated by forming the switching layer 106, arranging the switching layer 106 between the first conductor 102 and the second conductor 104, and arranging one or more magnetic layers (e.g. magnetic layers 108, 110) such that the one or more magnetic layers provide a magnetic field through the switching layer 106.

FIGS. 4A to 4C show simplified cross-sectional views that illustrate a method for fabricating the memory device 100 according to various non-limiting embodiments.

Referring to FIG. 4A, the method may include forming the first insulating layer 112 and forming the first conductor 102 through the first insulating layer 112. In various non-limiting embodiments, the first conductor 102 may be formed by etching the first insulating layer 112 (using, for example, a photoresist mask) to form an opening, and depositing conductive material into the opening.

Referring to FIG. 4B, the method may further include forming the first magnetic layer 108 over the first insulating layer 112, forming the switching layer 106 over the first magnetic layer 108 and forming the second magnetic layer 110 over the switching layer 106. In various non-limiting embodiments, the magnetic layers 108, 110 and the switching layer 106 may be formed by depositing an appropriate material (e.g. ferromagnetic material for the magnetic layers 108, 110 and oxide/non-oxide material for the switching layer 106) over the respective layers 112, 106, 108, and subsequently etching the material.

Referring to FIG. 4C, the method may further include forming the second insulating layer 114 over the second magnetic layer 110 and forming the second conductor 104 through the second insulating layer 114. In various non-limiting embodiments, the second conductor 104 may be formed in a similar manner as the formation of the first conductor 102 described above.

The above described order for the method is only intended to be illustrative, and the method is not limited to the above specifically described order unless otherwise specifically stated.

In the memory device 100, the switching layer 106 may be spaced apart from the first conductor 102 and the second conductor 104 via the magnetic layers 108, 110 respectively. However, in alternative non-limiting embodiments, the switching layer 106 may contact at least one conductor 102, 104. For example, in some exemplary non-limiting embodiments, at least one conductor 102, 104 may be arranged through at least one magnetic layer 108, 110 to contact the switching layer 106.

Figure 5:
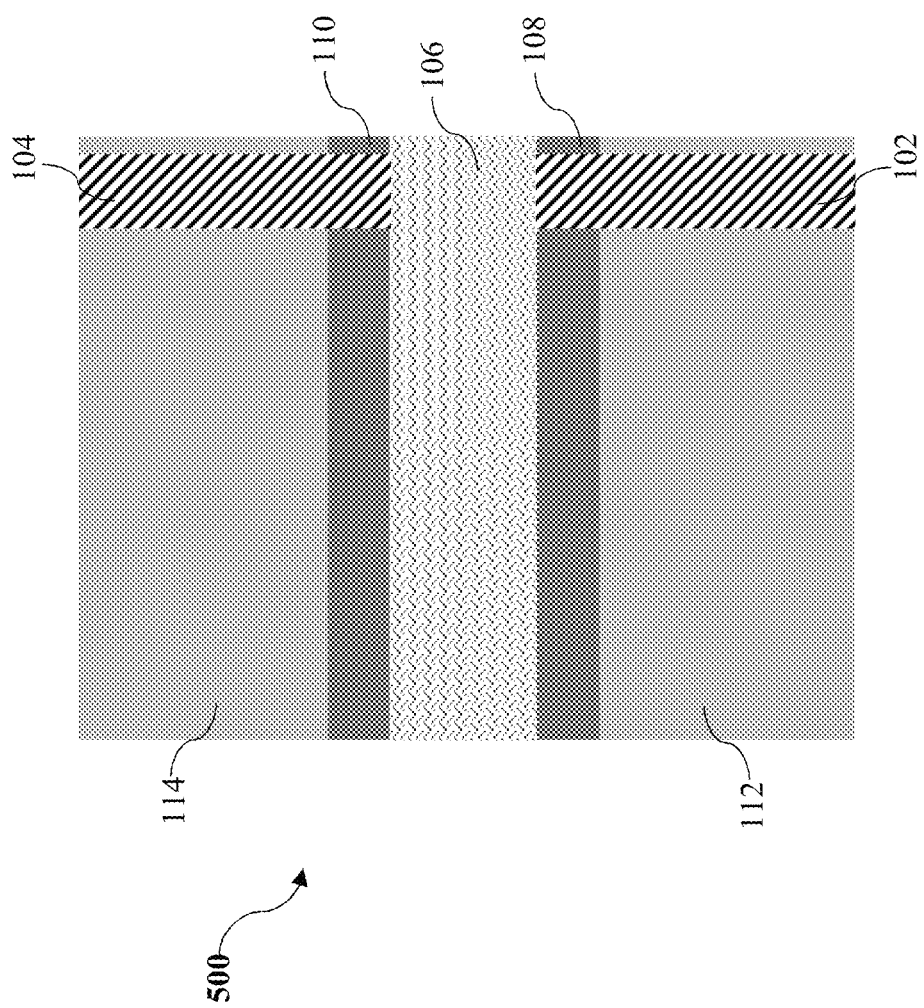
FIG. 5 shows a simplified cross-sectional view of a memory device according to alternative non-limiting embodiments.

FIG. 5 shows a simplified cross-sectional view of a memory device 500 according to alternative non-limiting embodiments. Memory device 500 is similar to memory device 100, and thus, the common features are labelled with the same reference numerals and need not be discussed.

As shown in FIG. 5, the memory device 500 may also include first and second conductors 102, 104, a switching layer 106, and first and second magnetic layers 108, 110 arranged horizontally parallel to the switching layer 106. However, different from the memory device 100, the conductors 102, 104 may contact the switching layer 106. For example, the first conductor 102 may be arranged through the first magnetic layer 108 to contact the switching layer 106, whereas the second conductor 104 may be arranged through the second magnetic layer 110 to contact the switching layer 106.

FIGS. 6A to 6E show simplified cross-sectional views that illustrate a method for fabricating the memory device 500 according to various non-limiting embodiments.

Figure 6C:
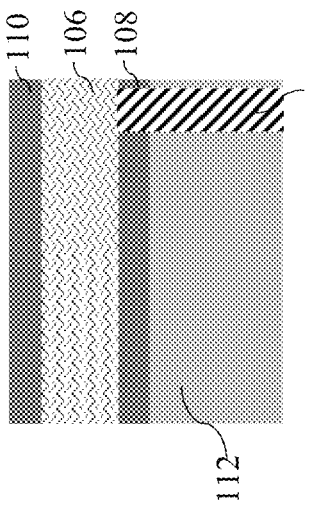
FIGS. 6A to 6E show simplified cross-sectional views that illustrate a method for fabricating the memory device of FIG. 5 according to various non-limiting embodiments.
Figure 6B:
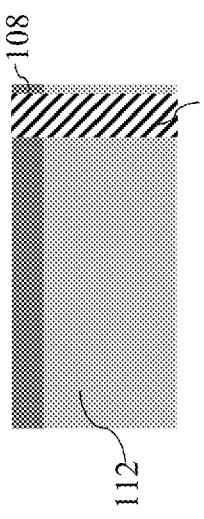
Figure 6E:
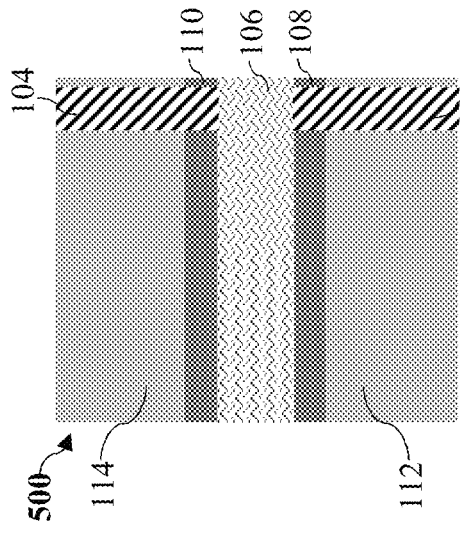
Figure 6A:
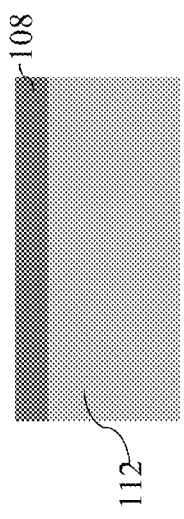

Referring to FIG. 6A, the method may include forming the first insulating layer 112 and forming the first magnetic layer 108 over the first insulating layer 112 using any method known to those skilled in the art.

Referring to FIG. 6B, the method may further include forming the first conductor 102 through the first insulating layer 112 and the first magnetic layer 108. In various non-limiting embodiments, the first conductor 102 may be formed by etching the first insulating layer 112 and the first magnetic layer 108 (using for example, a photoresist mask) to form an opening, and depositing conductive material into the opening.

Referring to FIG. 6C, the method may further include forming the switching layer 106 over the first magnetic layer 108, and forming the second magnetic layer 110 over the switching layer 106. In various non-limiting embodiments, the switching layer 106 and the second magnetic layer 110 may be formed by depositing an appropriate material (e.g. oxide/non-oxide material for the switching layer 106 and ferromagnetic material for the magnetic layer 110) over the respective layers 108, 106, and subsequently etching the material.

Figure 6D:
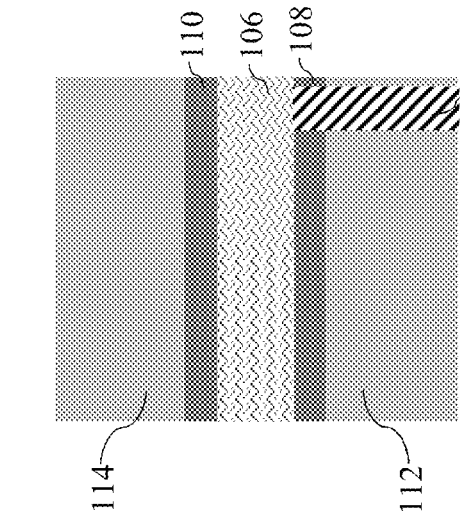

Referring to FIG. 6D, the method may further include forming the second insulating layer 114 over the second magnetic layer 110. In various non-limiting embodiments, the second insulating layer 114 may be formed by depositing dielectric material over the second magnetic layer 110 using any method known to those skilled in the art.

Referring to FIG. 6E, the method may further include forming the second conductor 104 through the second insulating layer 114 and the second magnetic layer 110. In various non-limiting embodiments, the second conductor 104 may be formed in a similar manner as the formation of the first conductor 102 as described above.

The above described order for the method is only intended to be illustrative, and the method is not limited to the above specifically described order unless otherwise specifically stated.

In the memory devices 100, 500, the first and second conductors 102, 104 may contact the first and second magnetic layers 108, 110 respectively. However, in alternative non-limiting embodiments, an insulating material may be arranged between at least one magnetic layer 108, 110 and at least one conductor 102, 104.

Figure 7:
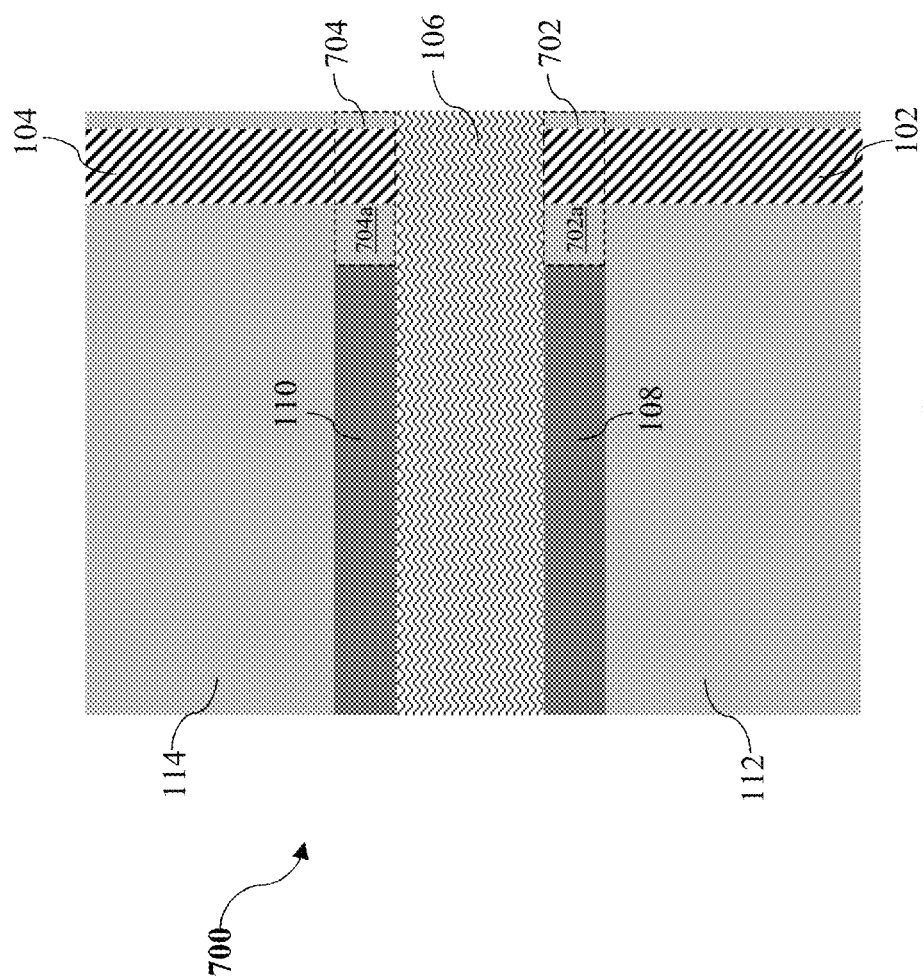
FIG. 7 shows a simplified cross-sectional view of a memory device according to alternative non-limiting embodiments.

FIG. 7 shows a simplified cross-sectional view of a memory device 700 according to alternative non-limiting embodiments. Memory device 700 is similar to memory devices 100, 500, and thus, the common features are labelled with the same reference numerals and need not be discussed.

As shown in FIG. 7, the memory device 700 may also include first and second conductors 102, 104, a switching layer 106, and first and second magnetic layers 108, 110 arranged horizontally parallel to the switching layer 106. However, different from the memory devices 100, 500, the magnetic layers 108, 110 may be spaced apart from the first and second conductors 102, 104 in the memory device 700. In particular, as shown in FIG. 7, the memory device 700 may further include a third insulating layer 702 and a fourth insulating layer 704. The first conductor 102 may be arranged through the first insulating layer 112 and the third insulating layer 702, such that a first insulating material 702a may be arranged between the first magnetic layer 108 and the first conductor 102. The second conductor 104 may be arranged through the second insulating layer 114 and the fourth insulating layer 704, such that a second insulating material 704a may be arranged between the second magnetic layer 110 and the second conductor 104.

FIGS. 8A to 8E show simplified cross-sectional views that illustrate a method for fabricating the memory device 700 according to various non-limiting embodiments.

Referring to FIG. 8A, the method may include forming the first insulating layer 112, and forming the first magnetic layer 108 over the first insulating layer 112. In various non-limiting embodiments, the first magnetic layer 108 may be formed by depositing ferromagnetic material over the first insulating layer 112, and etching the ferromagnetic material.

Referring to FIG. 8B, the method may further include forming the third insulating layer 702, and forming the first conductor 102 through the third insulating layer 702 and the first insulating layer 112. In various non-limiting embodiments, the first conductor 102 may be formed by etching the first and third insulating layers 112, 702 (using, for example, a photoresist mask) to form an opening and depositing conductive material into the opening.

Referring to FIG. 8C, the method may further include forming the switching layer 106 over the first magnetic layer 108 and the third insulating layer 702. In various non-limiting embodiments, the switching layer 106 may be formed by depositing oxide material over the first magnetic layer 108 and third insulating layer 702, and etching the oxide material. In alternative non-limiting embodiments, non-oxide material may be used instead of oxide material to form the switching layer 106.

Referring to FIG. 8D, the method may further include forming the second magnetic layer 110 over the switching layer 106. In various non-limiting embodiments, the second magnetic layer 110 may be formed by depositing ferromagnetic material over the switching layer 106 and etching the ferromagnetic material.

Referring to FIG. 8E, the method may further include forming the second and fourth insulating layers 114, 704, and forming the second conductor 104 through these insulating layers 114, 704. In various non-limiting embodiments, the second insulating layer 114 and the fourth insulating layer 704 may be formed simultaneously by depositing insulating material over the second magnetic layer 110 and the switching layer 106. In various non-limiting embodiments, the second conductor 104 may be formed by etching the second and fourth insulating layers 114, 704 (using, for example, a photoresist mask) to form an opening and depositing conductive material into the opening.

The above described order for the method is only intended to be illustrative, and the method is not limited to the above specifically described order unless otherwise specifically stated.

In the memory devices 100, 500, 700, the magnetic layers 108, 110 may contact the switching layer 106. However, in alternative non-limiting embodiments, the magnetic layers 108, 110 may be spaced apart from the switching layer 106. For instance, an insulating material may be arranged between the switching layer 106 and at least one magnetic layer 108, 110. Further, in the memory devices 100, 500, 700, the magnetic layers 108, 110 may be arranged horizontally parallel to the switching layer 106. However, in alternative non-limiting embodiments, at least one magnetic layer 108, 110 may be arranged vertically parallel to the switching layer 106. In some exemplary non-limiting embodiments, the magnetic layers 108, 110 may be arranged horizontally parallel to the switching layer 106 and spaced apart from the switching layer 106. For example, a conductive spacer may be arranged between the magnetic layers 108, 110 and the switching layer 106 in the memory device 100, so that current may still pass between the conductors 102, 104. In other non-limiting examples, a conductive spacer may also be arranged between the magnetic layers 108, 110 and the switching layer 106 in the memory devices 500, 700. Alternatively, in the memory devices 500, 700, since the conductors 102, 104 may contact the switching layer 106, an insulating material may be arranged between the magnetic layers 108, 110 and the switching layer 106. In the memory device 500, each conductor 102, 104 may further be arranged to pass through the respective magnetic layer 108, 110 and the insulating material, to contact the switching layer 106. In other exemplary non-limiting embodiments, the magnetic layers 108, 110 may be arranged vertically parallel to the switching layer 106 and spaced apart from the switching layer 106.

Figure 9:
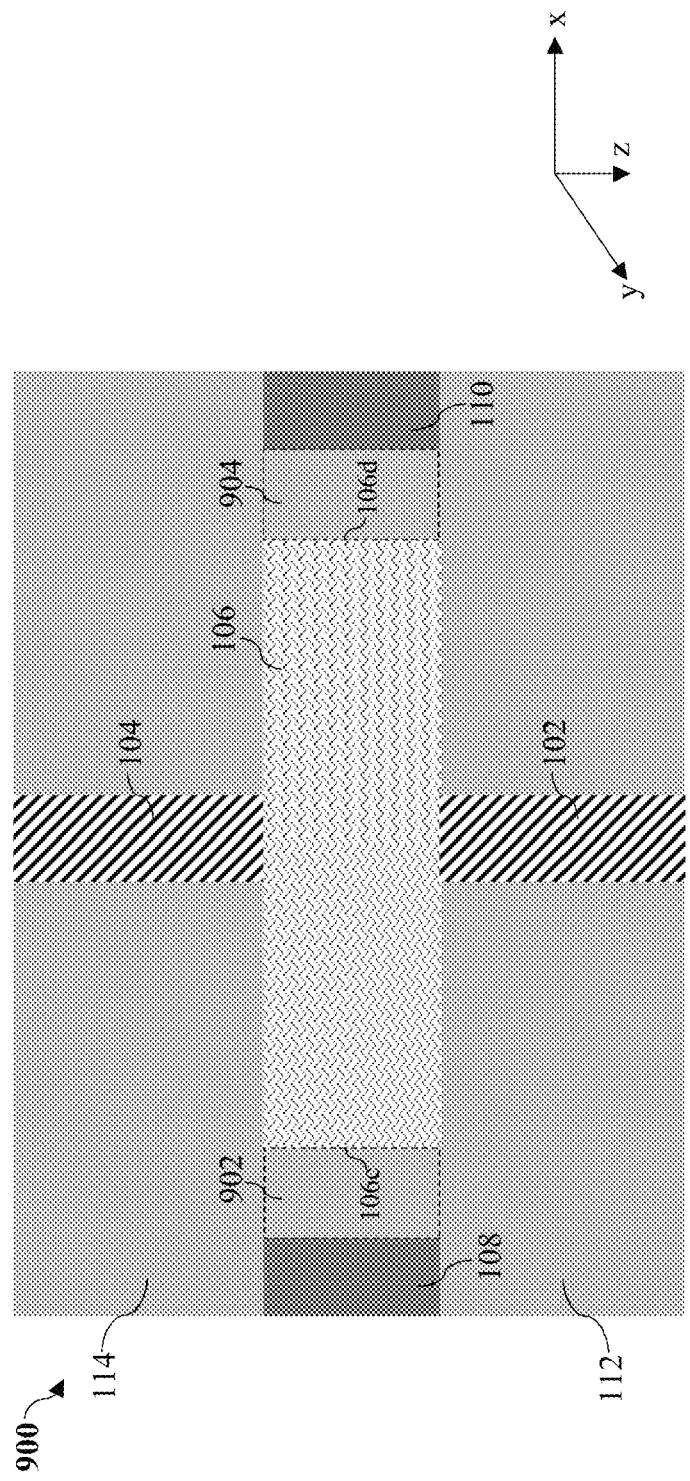
FIG. 9 shows a simplified cross-sectional view of a memory device according to alternative non-limiting embodiments.

FIG. 9 shows a simplified cross-sectional view of a memory device 900 according to alternative non-limiting embodiments. Memory device 900 is similar to memory devices 100, 500, 700 and thus, the common features are labelled with the same reference numerals and need not be discussed.

As shown in FIG. 9, the memory device 900 may also include first and second conductors 102, 104, a switching layer 106, and first and second magnetic layers 108, 110. However, different from the memory devices 100, 500, 700, the magnetic layers 108, 110 may be arranged vertically parallel to the switching layer 106. In particular, in the exemplary non-limiting embodiment in FIG. 9, the first and second magnetic layers 108, 110 may be arranged parallel to vertical sides 106c, 106d of the switching layer 106 (note that the sides 106c, 106d are not labelled in the remaining figures to avoid cluttering the figures). Further, the magnetic layers 108, 110 may be spaced apart from the switching layer 106. For example, as shown in FIG. 9, the memory device 900 may include a first further insulating layer 902 (including insulating material) arranged between the first magnetic layer 108 and the switching layer 106. The memory device 900 may also include a second further insulating layer 904 (including insulating material) arranged between the second magnetic layer 110 and the switching layer 106. Similar to the memory devices 500, 700, the first conductor 102 and the second conductor 104 may contact the switching layer 106. However, the first conductor 102 and the second conductor 104 may not contact the magnetic layers 108, 110.

While the magnetic field provided by the magnetic layers 108, 110 in the memory devices 100, 500, 700 may pass through the switching layer 106 in an x-direction as shown in FIG. 2B, the magnetic field provided by the magnetic layers 108, 110 in the memory device 900 may pass through the switching layer 106 in a y-direction (or out of the paper as seen in FIG. 9) due to the arrangement of the magnetic layers 108, 110 relative to the switching layer 106. In other words, the magnetic field through the switching layer 106 in the memory devices 100, 500, 700 may include an x-direction spin; whereas, that in the memory device 900 may include a y-direction spin.

FIGS. 10A to 10E show simplified cross-sectional views that illustrate a method for fabricating the memory device 900 according to various non-limiting embodiments.

Referring to FIG. 10A, the method may include forming the first insulating layer 112 and forming the first conductor 102 through the first insulating layer 112. In various non-limiting embodiments, the first conductor 102 may be formed by etching the first insulating layer 112 (using, for example, a photoresist mask) to form an opening, and depositing conductive material into the opening.

Referring to FIG. 10B, the method may further include forming the switching layer 106 over the first insulating layer 112. In various non-limiting embodiments, the switching layer 106 may be formed by depositing oxide material over the first insulating layer 112 and etching the oxide material. In alternative non-limiting embodiments, non-oxide material instead of oxide material may be used to form the switching layer 106.

Referring to FIG. 10C, the method may further include forming the first further insulating layer 902 and the second further insulating layer 904 over the first insulating layer 112. In various non-limiting embodiments, the first and second further insulating layers 902, 904 may be formed by depositing insulating material over the first insulating layer 112, smoothing a top surface of the insulating material to align the top surface of the insulating material with a top surface of the switching layer 106, and etching the insulating material. In various non-limiting embodiments, the smoothing may be done using any method known to those skilled in the art, such as, but not limited to, a chemical mechanical polishing (CMP) process.

Referring to FIG. 10D, the method may further include forming the first and second magnetic layers 108, 110 over the first insulating layer 112. In various non-limiting embodiments, the first and second magnetic layers 108, 110 may be formed by depositing ferromagnetic material over the first insulating layer 112, smoothing a top surface of the ferromagnetic material to align the top surface of the ferromagnetic material with the top surfaces of the further insulating layers 902, 904. The ferromagnetic material may subsequently be etched. In various non-limiting embodiments, the smoothing may be done using any method as known to those skilled in the art, such as, but not limited to, a chemical mechanical polishing (CMP) process.

Referring to FIG. 10E, the method may further include forming the second insulating layer 114 and the second conductor 114 through the second insulating layer 114. In various non-limiting embodiments, the second insulating layer 114 may be formed by depositing insulating material over the switching layer 106, the further insulating layers 902, 904, and the magnetic layers 108, 110. In various non-limiting embodiments, the second conductor 114 may be formed by etching the second insulating layer 114 (using, for example, a photoresist mask) to form an opening and depositing conductive material into the opening.

The above described order for the method is only intended to be illustrative, and the method is not limited to the above specifically described order unless otherwise specifically stated.

As compared to the memory devices 500, 700, 900, the memory device 100 may be more easily fabricated. Further, the memory devices 100, 500 may have a smaller cell size as compared to the memory devices 700, 900.

As the conductors 102, 104 may be formed of a different material from the magnetic layers 108, 110, arranging the conductors 102, 104 to contact the magnetic layers 108, 110 may cause a distortion in the spin orientation of the magnetic field at the interface between the conductors 102, 104 and the magnetic layers 108, 110. This may be due to the diffusion of the different materials across the interface. With the conductors 102, 104 arranged through the magnetic layers 108, 110 in the memory device 500, the interface between the conductors 102, 104 and the magnetic layers 108, 110 may have a larger surface area and may be nearer the switching layer 106 as compared to that in the memory device 100. Accordingly, the distortion (caused by the conductors 102, 104) in the spin orientation of the magnetic field provided by the magnetic layers 108, 110 may be greater in the memory device 500 than in the other memory devices 100, 700, 900.

In various non-limiting embodiments, when current passes through a magnetic layer 108/110, the electrons in the current may be polarized. The spin orientation of some of these electrons may be opposite to the spin orientation of the magnetic field in the magnetic layer 108/110. These electrons may thus alter the spin orientation of the magnetic field in the magnetic layer 108/110, especially if the current has a large magnitude or if the magnetic field is weak. Since each magnetic layer 108/110 may be arranged between a conductor 102, 104 and the switching layer 106 in the memory device 100, the current through each conductor 102, 104 may pass through the respective magnetic layer 108, 110. Accordingly, there may be greater distortion in the spin orientation of the magnetic field provided by the magnetic layers 108, 110 in memory device 100 (due to current through the magnetic layers 108, 110) as compared to the other memory devices 500, 700, 900.

Further, the magnetic field passing through the switching layer 106 may be weaker if the magnetic layers 108, 110 are spaced apart from the switching layer 106. Accordingly, the magnetic field passing through the switching layer 106 may be weaker in the memory device 900, as compared to the other memory devices 100, 500, 700.

In the non-limiting embodiments as shown in FIGS. 1, 5, 7 and 9, each memory device 100, 500, 700, 900 may include two magnetic layers 108, 110. However, in alternative non-limiting embodiments, the memory device 100, 500, 700, 900 may instead include a single magnetic layer (as long as the magnetic field provided by the single magnetic layer is strong enough to sufficiently reduce the rate of change in state of the memory device 100, 500, 700, 900). Including only a single magnetic layer may help simplify the fabrication process of the memory device 100, 500, 700, 900, hence reducing costs. In alternative non-limiting embodiments, the memory device 100, 500, 700, 900 may include more than two magnetic layers, where one or more of the magnetic layers may be arranged horizontally parallel to the switching layer 106, and/or one or more of the magnetic layers may be arranged vertically parallel to the switching layer 106.

For example, FIG. 11A and FIG. 11B show simplified cross-sectional views of memory devices 1100 and 1110 respectively according to alternative non-limiting embodiments. Memory devices 1100, 1110 are similar to memory device 100, and thus, the common features are labelled with the same reference numerals and need not be discussed.

As shown in FIG. 11A, different from the memory device 100, the memory device 1100 may include only the first magnetic layer 108. Similarly, as shown in FIG. 11, different from the memory device 100, the memory device 1110 may include only the second magnetic layer 110. Said differently, the memory device 1100 and 1110 may have only one magnetic layer in a non-limiting embodiment.

In various non-limiting embodiments, the memory device 100, 500, 700, 900, 1100, 1110 may further include at least one adjusting element configured to adjust the magnetic field through the switching layer 106. The adjusting element(s) may be formed of an electrically conductive material. In various non-limiting embodiments, the adjusting element(s) may include a metal line and the memory device 100, 500, 700, 900, 1000, 1110 may be configured to provide an electric current through the at least one adjusting element. This current may induce a magnetic field around the at least one adjusting element and the induced magnetic field may in turn affect the magnetic field provided by the magnetic layers 108, 110 (for example, the induced magnetic field may alter the spin orientation of the magnetic layers 108, 110). This may in turn affect the magnetic field through the switching layer 106, and thus the rate of change in the resistance of the switching layer 106 when the voltage across the switching layer 106 changes. The degree at which the magnetic field provided by the magnetic layers 108, 110 is affected by the adjusting element(s) may be determined by the magnitude of the induced magnetic field. This may in turn be varied by varying a magnitude of the current through the adjusting element(s). Accordingly, in a memory structure including a plurality of memory devices (where each memory device may be one of the memory devices 100, 500, 700, 900, 1100, 1110), the rate of change of the state of each memory device may be controlled individually by varying the magnitude of the current through the adjusting element(s) of the memory device. Further, each memory device may be configured to be a multi-bit memory device by varying the magnitude of the current through the adjusting element(s), to achieve different resistance values during the setting of the memory device.

In some exemplary non-limiting embodiments, each memory device 100, 500, 700, 900, 1100, 1110 may include a single adjusting element. In other exemplary non-limiting embodiments, each memory device 100, 500, 700, 900, 1100, 1110 may include a plurality of adjusting elements. In various non-limiting embodiments, at least one conductor 102, 104 may include a wider portion and a narrower portion, and the adjusting element(s) may be arranged equidistant from the switching layer 106 as the wider portion of the conductor(s) 102, 104. In various non-limiting embodiments, an insulating material may be arranged between the adjusting element(s) and at least one conductor 102, 104.

Figure 12C:
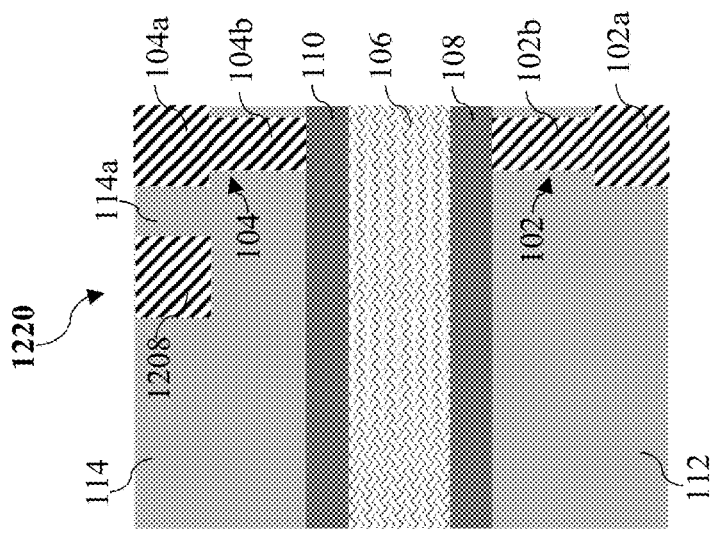
FIGS. 12A to 12C show simplified cross-sectional views of memory devices according to alternative non-limiting embodiments.
Figure 12B:
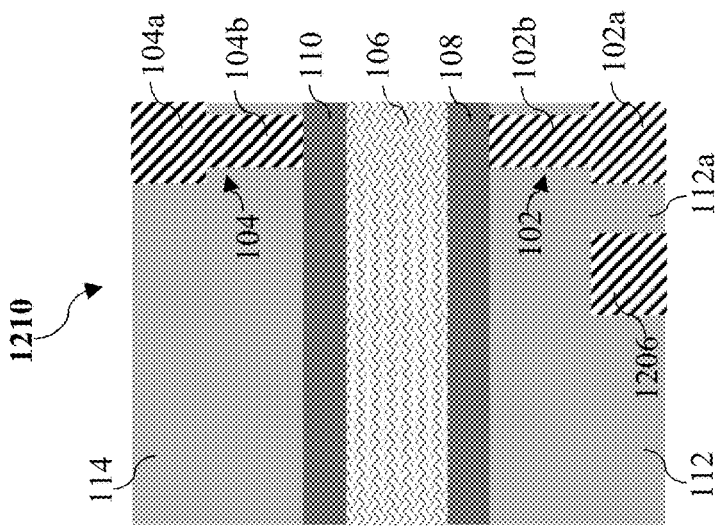
Figure 12A:
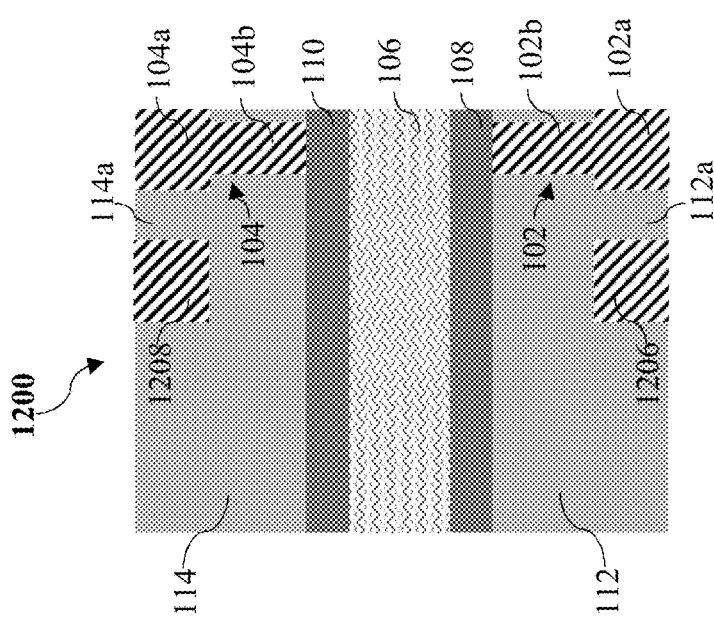

For example, FIGS. 12A-12C show simplified cross-sectional views of memory devices 1200, 1202, 1204 respectively according to alternative non-limiting embodiments. Memory devices 1200, 1202, 1204 are similar to memory device 100, and thus, the common features are labelled with the same reference numerals and need not be discussed.

The memory device 1200 may be different from the memory device 100 in that it may further include a first adjusting element 1206 and a second adjusting element 1208. The first adjusting element 1206 may be at least partially arranged within the first insulating layer 112 and the second adjusting element 1208 may be at least partially arranged within the second insulating layer 114, such that the switching layer 106 may be arranged between the first adjusting element 1206 and the second adjusting element 1208.

In the exemplary non-limiting embodiment in FIG. 12A, the first conductor 102 may include a wider portion 102a (with a larger diameter) and a narrower portion 102b (with a smaller diameter). Similarly, the second conductor 104 may include a wider portion 104a (with a larger diameter) and a narrower portion 104b (with a smaller diameter). A diameter of the wider portions 102a, 104a of the conductors 102, 104 may be the same in the exemplary non-limiting embodiment in FIG. 12A, but may be different in other non-limiting embodiments. Similarly, a diameter of the narrower portions 102b, 104b of the conductors 102, 104 may be the same in the exemplary non-limiting embodiment in FIG. 12A, but may be different in other non-limiting embodiments. Further, in some exemplary non-limiting embodiments, a diameter of each conductor 102, 104 may instead be uniform.

As shown in FIG. 12A, the first adjusting element 1206 may be arranged equidistant from the switching layer 106 as the wider portion 102a of the first conductor 102. The second adjusting element 1208 may be arranged equidistant from the switching layer 108 as the wider portion 104a of the second conductor 104. For example, the first adjusting element 1206 and the wider portion 102a of the first conductor 102 may both be arranged in contact with a bottom surface of the memory device 1200. The second adjusting element 1208 and the wider portion 104a of the second conductor 104 may both be arranged in contact with a top surface of the memory device 1200. In addition, the first and second adjusting elements 1206, 1208 may be spaced apart from the first and second conductors 102, 104 respectively. For example, a first insulating material 112a, that may be part of the first insulating layer 112, may be arranged between the first conductor 102 (e.g. the wider portion 102a) and the first adjusting element 1206. Similarly, a second insulating material 114a, that may be part of the second insulating layer 114, may be arranged between the second conductor 104 (e.g. the wider portion 104a) and the second adjusting element 1208. However, the adjusting elements 1206, 1208 may be arranged in any manner as long as the magnetic field through the switching layer 106 may be affected by the magnetic field induced by current through the adjusting elements 1206, 1208.

In various non-limiting embodiments, passing a first current through the first adjusting element 1206 may induce a first magnetic field and passing a second current through the second adjusting element 1208 may induce a second magnetic field. The first and second induced magnetic fields may both affect the magnetic field provided by the magnetic layers 108, 110. However, in alternative non-limiting embodiments, passing a current through a single adjusting element to produce a single induced magnetic field may be enough to sufficiently affect the magnetic field provided by the magnetic layers 108, 110. For instance, in the exemplary non-limiting embodiment in FIG. 12B, the memory device 1210 may consist of only the first adjusting element 1206; and in the exemplary non-limiting embodiment in FIG. 12C, the memory device 1220 may consist of only the second adjusting element 1208.

Figure 13A:
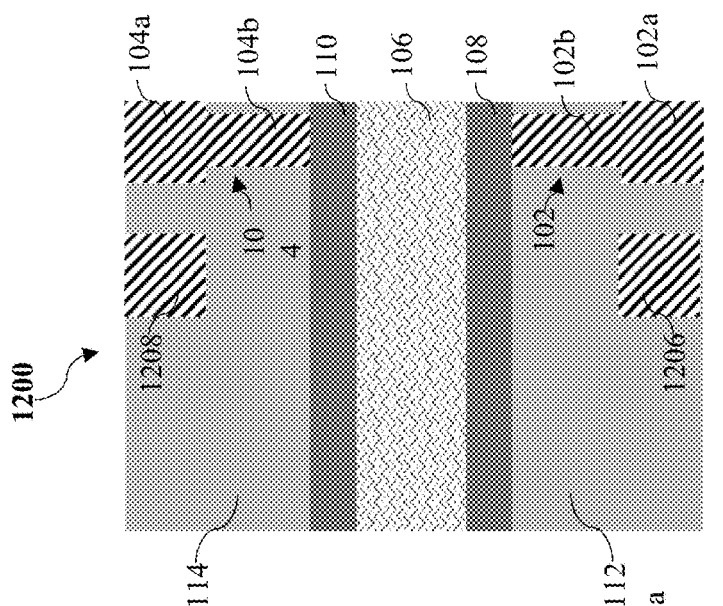
FIGS. 13A to 13C show simplified cross-sectional views that illustrate a method for fabricating the memory device of FIG. 12A according to various non-limiting embodiments.
Figure 13B:
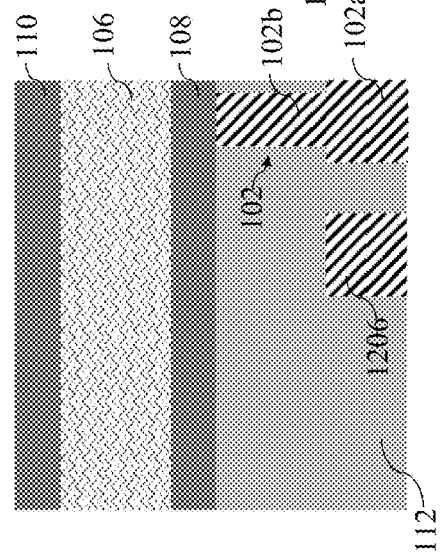
Figure 13C:
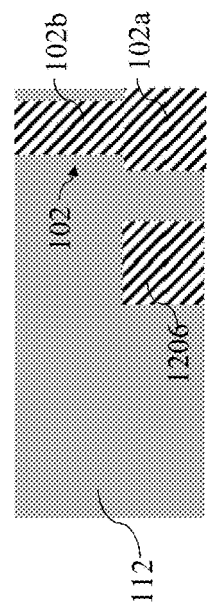

FIGS. 13A to 13C show simplified cross-sectional views that illustrate a method for fabricating the memory device 1200 according to various non-limiting embodiments. The method in FIGS. 13A to 13C may be similar to the method in FIGS. 4A to 4C.

Referring to FIG. 13A, the method may include forming the first insulating layer 112, forming the first adjusting element 1206 at least partially within the first insulating layer 112 and forming the first conductor 102 through the first insulating layer 112. In various non-limiting embodiments, the method may include forming the first adjusting element 1206 and the wider portion 102a of the first conductor 102 simultaneously. For example, a first part of the first insulating layer 112 may first be formed and etched to provide openings for the first adjusting element 1206 and the wider portion 102a of the first conductor 102. These openings may then be filled with conductive material simultaneously to form the first adjusting element 1206 and the wider portion 102a of the first conductor 102. A second part of the first insulating layer 112 may then be formed over the first part of the first insulating layer 112, and etched to form an opening. The opening may then be filled with conductive material to form the narrower portion 102b of the first conductor 102.

Referring to FIG. 13B, the method may include forming the magnetic layers 108, 110 and the switching layer 106. FIG. 13B may be similar to FIG. 4B, and hence, need not be discussed further.

Referring to FIG. 13C, the method may further include forming the second insulating layer 114, forming the second adjusting element 1208 at least partially within the second insulating layer 114 and forming the second conductor 104 through the second insulating layer 114. The second adjusting element 1208 and the second conductor 104 may be formed in a similar manner as the first adjusting element 1208 and the first conductor 102 (as described above). In other words, the second adjusting element 1208 and the wider portion 104a of the second conductor 104 may be formed simultaneously.

The above described order for the method is only intended to be illustrative, and the method is not limited to the above specifically described order unless otherwise specifically stated.

FIG. 14A shows a simplified cross-sectional view of a memory device 1400 according to alternative non-limiting embodiments. FIG. 14B shows a simplified cross-sectional view of the memory device 1400 along the line A-A' of FIG. 14A. The memory device 1400 is similar to the memory device 900, and thus, the common features are labelled with the same reference numerals and need not be discussed.

Referring to FIG. 14B, the memory device 1400 may be different from the memory device 900 in that it may further include an adjusting element 1402 that may be at least partially arranged within the second insulating layer 114. Although a single adjusting element 1402 is shown in FIG. 14B, it is understood that in other non-limiting embodiments, the memory device 1400 may include more than one adjusting element. The memory device 1400 may also include a third further insulating layer 1404 and a fourth further insulating layer 1406 that may isolate the switching layer 106 from the sides of the memory device 106. However, in alternative non-limiting embodiments, the switching layer 106 may extend across an entire length of the memory device 1400.

In the exemplary non-limiting embodiment in FIGS. 14A and 14B, each conductor 102, 104 may include a wider portion 102a, 104a (with a larger diameter) and a narrower portion 102b, 104b (with a smaller diameter). The wider portions 102a, 102b of the conductors 102, 104 may have a different diameter (with the wider portion 104a having a larger diameter than the wider portion 102a), and the narrower portions 102b, 104b of the conductors 102, 104 may have a same diameter. However, the diameters of the conductors 102, 104 may be varied in other non-limiting embodiments.

In the exemplary non-limiting embodiment of FIG. 14B, the adjusting element 1402 may be arranged horizontally parallel to the switching layer 106, spaced apart from the second conductor 104. In other words, an insulating material 114a, which may be part of the second insulating layer 114, may be arranged between the second conductor 104 (e.g. the wider portion 104a) and the adjusting element 1402. Also, the adjusting element 1402 may be arranged equidistant from the switching layer 106 as the wider portion 104a of the second conductor 104. For example, the adjusting element 1402 and the wider portion 104a of the second conductor 104 may both be arranged to contact a top surface of the memory device 1400. However, the adjusting element 1402 may be arranged in any manner as long as the magnetic field provided by the magnetic layers 108, 110 through the switching layer 106 may be affected by the magnetic field induced by current through the adjusting element 1402.

FIGS. 15A to 15E show simplified cross-sectional views that illustrate a method for fabricating the memory device 1400 according to various non-limiting embodiments. The method in the exemplary non-limiting embodiment of FIGS. 15A-15E may be similar to that in the exemplary non-limiting embodiment of FIGS. 10A-10E.

Referring to FIG. 15A, the method may include forming the first insulating layer 112 and forming the first conductor 102 through the first insulating layer 112. In various non-limiting embodiments, a first part of the first insulating layer 112 may first be formed and etched to provide an opening, and a conductive material may be deposited into the opening to form the wider portion 102a of the first conductor 102. A second part of the first insulating layer 112 may then be formed over the first part. The second part of the second insulating layer 112 may then be etched to form an opening, and a conductive material may be deposited into the opening to form the narrower portion 102b of the first conductor 102.

Referring to FIGS. 15B to 15D, the method may further include forming the switching layer 106, the further insulating layers 902, 904, 1404, 1406 and the magnetic layers 108, 110. FIGS. 15B-15D may be similar to FIGS. 10B-10D respectively, and hence need not be discussed further.

Referring to FIG. 15E, the method may include forming the second insulating layer 114 and forming the second conductor 104 through the second insulating layer 114. The method may further including forming the adjusting element 1402 (not shown in FIG. 15E) at least partially within the second insulating layer 114. In various non-limiting embodiments, a first part of the second insulating layer 114 may first be formed over the switching layer 106, the further insulating layers 902, 904, 1404, 1406 and the magnetic layers 108, 110. The first part of the second insulating layer 114 may then be etched to form an opening, and a conductive material may be deposited into the opening to form the narrower portion 104b of the second conductor 104. A second part of the second insulating layer 114 may then be formed over the first part, and etched to form openings for the adjusting element 1402 and the wider portion 104b of the second conductor 104. The adjusting element 1402 and the wider portion 104b of the second conductor 104 may then be formed simultaneously by filling these openings with conductive material simultaneously.

The above described order for the method is only intended to be illustrative, and the method is not limited to the above specifically described order unless otherwise specifically stated.

Figure 16B:
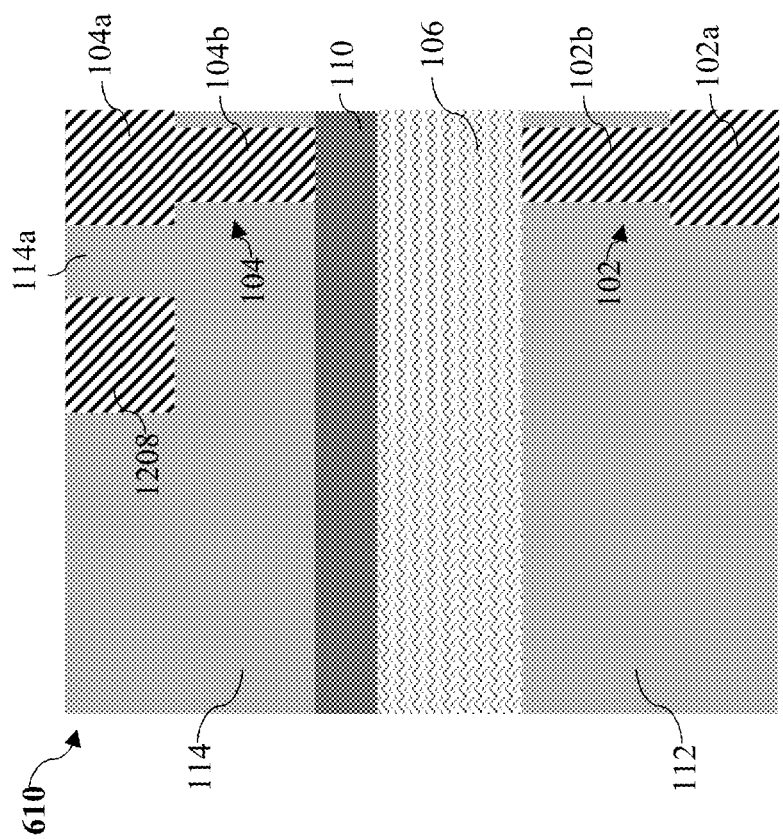
FIGS. 16A and 16B show simplified cross-sectional views of memory devices according to alternative non-limiting embodiments.
Figure 16A:
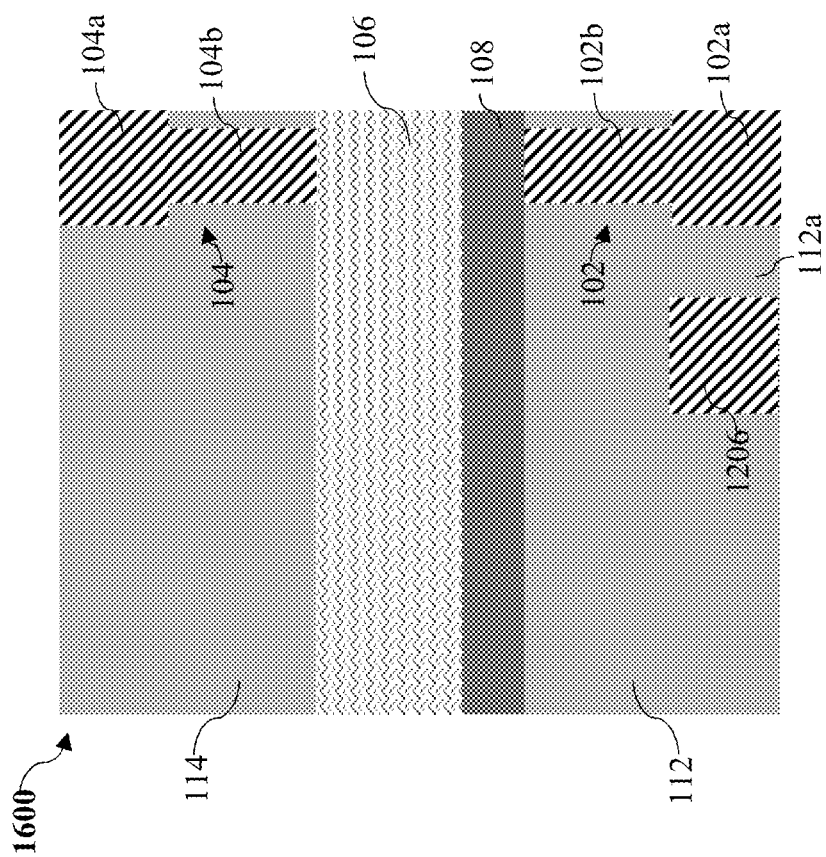

FIGS. 16A and 16B show simplified cross-sectional views of memory devices 1600, 1610 according to alternative non-limiting embodiments. Memory devices 1600, 1610 are similar to memory devices 1210, 1220, and hence, the common features are labelled with the same reference numerals and need not be discussed further.

As shown in FIG. 16A, different from the memory device 1210, the memory device 1600 may consist of only a single magnetic layer 108. As shown in FIG. 16B, different from the memory device 1220, the memory device 1610 may consist of only a single magnetic layer 110. In other non-limiting embodiments, the memory devices 1600, 1610 may each have more than two magnetic layers 108, 110, and/or more than one adjusting element 1402.

The following examples pertain to further embodiments.

Example 1 may be a memory device including: a first conductor and a second conductor; a switching layer arranged between the first conductor and the second conductor, wherein the switching layer may be configured to have a switchable resistance in response to a change in voltage between the first conductor and the second conductor; and one or more magnetic layers arranged such that the one or more magnetic layers may provide a magnetic field through the switching layer.

In Example 2, the subject matter of Example 1 may optionally include that the one or more magnetic layers may be arranged in parallel to one or more sides of the switching layer.

In Example 3, the subject matter of Example 1 or Example 2 may optionally include that at least one magnetic layer of the one or more magnetic layers may be arranged horizontally parallel to the switching layer.

In Example 4, the subject matter of any one of Examples 1 to 3 may optionally include that at least one magnetic layer of the one or more magnetic layers may be arranged vertically parallel to the switching layer.

In Example 5, the subject matter of any one of Examples 1 to 4 may optionally include that the at least one magnetic layer of the one or more magnetic layers may be arranged between the switching layer and at least one conductor of the first conductor and the second conductor.

In Example 6, the subject matter of any one of Examples 1 to 4 may optionally include that the switching layer may contact at least one conductor of the first conductor and the second conductor.

In Example 7, the subject matter of any one of Examples 1 to 6 may optionally include that at least one conductor of the first conductor and the second conductor may be arranged through at least one magnetic layer of the one or more magnetic layers to contact the switching layer.

In Example 8, the subject matter of any one of Examples 1 to 6 may optionally include that the memory device may further include an insulating material arranged between at least one magnetic layer of the one or more magnetic layers and at least one conductor of the first conductor and the second conductor.

In Example 9, the subject matter of any one of Examples 1 to 8 may optionally include that the switching layer may contact at least one magnetic layer of the one or more magnetic layers.

In Example 10, the subject matter of any one of Examples 1 to 8 may optionally include that the memory device may further include an insulating material arranged between the switching layer and at least one magnetic layer of the one or more magnetic layers.

In Example 11, the subject matter of any one of Examples 1 to 10 may optionally include that the one or more magnetic layers may consist of a single magnetic layer.

In Example 12, the subject matter of any one of Examples 1 to 10 may optionally include that the one or more magnetic layers may include a first magnetic layer and a second magnetic layer, and wherein the switching layer may be arranged between the first magnetic layer and the second magnetic layer.

In Example 13, the subject matter of any one of Examples 1 to 12 may optionally include that the memory device may further include at least one adjusting element configured to adjust the magnetic field through the switching layer.

In Example 14, the subject matter of Example 13 may optionally include that the at least one adjusting element may include a first adjusting element and a second adjusting element, and wherein the switching layer may be arranged between the first adjusting element and the second adjusting element.

In Example 15, the subject matter of Example 13 may optionally include that the at least one adjusting element may consist of a single adjusting element.

In Example 16, the subject matter of any one of Examples 13 to 15 may optionally include that the memory device may further include an insulating material arranged between the at least one adjusting element and at least one conductor of the first conductor and the second conductor.

In Example 17, the subject matter of any one of Examples 13 to 16 may optionally include that at least one conductor of the first conductor and the second conductor may include a wider portion and a narrower portion, and wherein the at least one adjusting element may be arranged equidistant from the switching layer as the wider portion of the at least one conductor of the first conductor and the second conductor.

In Example 18, the subject matter of any one of Examples 13 to 17 may optionally include that the at least one adjusting element may be formed of an electrically conductive material.

Example 19 may be a method including: forming a switching layer; arranging the switching layer between a first conductor and a second conductor; wherein the switching layer may be configured to have a switchable resistance in response to a change in voltage between the first conductor and the second conductor; and arranging one or more magnetic layers such that the one or more magnetic layers provide a magnetic field through the switching layer.

In Example 20, the subject matter of Example 19 may optionally include that at least one conductor of the first conductor and the second conductor may include a wider portion and a narrower portion, and wherein the method may further include simultaneously forming at least one adjusting element with the wider portion of the at least one conductor of the first conductor and the second conductor.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
   a first conductor and a second conductor, wherein the first conductor is a first via and the second conductor is a second via;
   a switching layer arranged between the first via and the second via, wherein the switching layer is configured to have a switchable resistance in response to a change in voltage between the first via and the second via, wherein the first via and the second via are arranged orthogonal to the switching layer; and
   a pair of magnetic layers, wherein the switching layer is arranged between the pair of magnetic layers along a first axis, such that the pair of magnetic layers provide a magnetic field through the switching layer,
   wherein the first via is further arranged to contact and overlap with the switching layer and the second via is further arranged to contact and underlap with the switching layer,
   wherein a length of the switching layer and a length of the pair of magnetic layers extend along a second axis, the second axis being orthogonal to the first axis and wherein a length of the first conductor and second conductor extends along the first axis,
   wherein the first conductor and the second conductor are arranged through the pair of magnetic layers to contact the switching layer.

2. The memory device of claim 1, further comprising insulating material arranged between the pair of magnetic layers and the first conductor and the second conductor.

3. The memory device of claim 1, wherein the switching layer directly contacts the pair of magnetic layers and wherein one magnetic layer overlaps a second portion of the switching layer and another magnetic layer underlaps the second portion of the switching layer.

4. The memory device of claim 1, further comprising at least one adjusting element configured to adjust the magnetic field through the switching layer, wherein the at least one adjusting element is arranged spaced apart from the first conductor and/or second conductor along the second axis and the at least one adjusting element is arranged spaced apart from the switching layer along the first axis.

5. The memory device of claim 4, wherein the at least one adjusting element comprises a first adjusting element and a second adjusting element, and wherein the switching layer is arranged between the first adjusting element and the second adjusting element.

6. The memory device of claim 4, wherein the at least one adjusting element consists of a single adjusting element.

7. The memory device of claim 4, further comprising an insulating material arranged between the at least one adjusting element and at least one conductor of the first conductor and the second conductor.

8. The memory device of claim 4, wherein the first conductor comprises a wider portion and a narrower portion, and wherein a surface of the at least one adjusting element is coplanar with a surface of the wider portion of the first conductor.

9. The memory device of claim 4, wherein the at least one adjusting element is formed of an electrically conductive material.

10. The memory device of claim 1, wherein a thickness of the switching layer along the first axis is larger than a thickness of each magnetic layer of the pair of magnetic layers along the first axis.

11. The memory device of claim 1, wherein the switching layer comprises a material configured to have a conducting filament formed therein in response to the change in voltage between the first conductor and the second conductor.

12. The memory device of claim 1, further comprising an insulating material arranged around the first conductor and the second conductor and extending substantially along the length of the switching layer.

13. The memory device of claim 1, wherein the first via is further arranged to be in direct contact and overlap with a first portion of the switching layer and the second via is further arranged to be in direct contact and underlap with the first portion of the switching layer.

14. A method comprising:
    forming a switching layer;
    arranging the switching layer between a first conductor and a second conductor;
    wherein the switching layer is configured to have a switchable resistance in response to a change in voltage between the first conductor and the second conductor, wherein the first conductor is a first via arranged orthogonal to the switching layer and the second conductor is a second via arranged orthogonal to the switching layer; and
        arranging the switching layer between a pair of magnetic layers along a first axis such that the pair of magnetic layers provide a magnetic field through the switching layer,
        wherein the first via is further arranged to contact and overlap with the switching layer and the second via is further arranged to contact and underlap with the switching layer,
        wherein a length of the switching layer and a length of the pair of magnetic layers extend along a second axis, the second axis being orthogonal to the first axis and wherein a length of the first conductor and second conductor extends along the first axis,
        wherein the first conductor and the second conductor are arranged through the pair of magnetic layers to contact the switching layer.

15. The method of claim 14, wherein the first conductor comprises a wider portion and a narrower portion, and wherein the method further comprises simultaneously forming at least one adjusting element with the wider portion of the first conductor.

16. The method of claim 14, wherein the first via is further arranged to be in direct contact and overlap with a first portion of the switching layer and the second via is further arranged to be in direct contact and underlap with the first portion of the switching layer.

17. A memory device comprising:
a first conductor and a second conductor, wherein the first conductor is a first via and the second conductor is a second via;
a switching layer arranged between the first via and the second via, wherein the switching layer is configured to have a switchable resistance in response to a change in voltage between the first via and the second via, wherein the first via and the second via are arranged orthogonal to the switching layer; and
a pair of magnetic layers, wherein the switching later us arranged between the pair of magnetic layers along a first axis, such that the pair of magnetic layers provide a magnetic field through the switching layer;
wherein the first via is further arranged to be in direct contact and overlap with only a first portion of the switching layer and the second via is further arranged to be in direct contact and underlap with only the first portion of the switching layer,
wherein a length of the switching layer extends along the first axis, and a length of the pair of magnetic layers extends along a second axis, the second axis being orthogonal to the first axis and wherein a length of the first conductor and second conductor extends along the second axis.

18. The memory device of claim 17, further comprises an adjusting element spaced apart from the first conductor along the first axis, wherein the adjusting element is spaced apart from the switching layer along the second axis.

19. The memory device of claim 17, further comprises an insulating material arranged between at least one magnetic layer of the pair of magnetic layers and the switching layer along the first axis.

20. The memory device of claim 17, wherein the switching layer and the pair of magnetic layers are formed in a same layer, wherein a width of the switching layer along the second axis is substantially the same as the length of each magnetic layer of the pair of magnetic layers along the second axis.

* * * * *